(12) United States Patent
Hayashi

(10) Patent No.: US 7,187,006 B2
(45) Date of Patent: Mar. 6, 2007

(54) ELECTRO-OPTICAL DEVICE, METHOD OF MANUFACTURING THE SAME, AND ELECTRONIC APPARATUS

(75) Inventor: Kenji Hayashi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 205 days.

(21) Appl. No.: 10/807,253

(22) Filed: Mar. 24, 2004

(65) Prior Publication Data

US 2004/0212759 A1 Oct. 28, 2004

(30) Foreign Application Priority Data

Mar. 27, 2003 (JP) .............................. 2003-088796
Jan. 6, 2004 (JP) .............................. 2004-001218

(51) Int. Cl.
*H01L 29/04* (2006.01)
(52) U.S. Cl. ......................................... 257/72; 257/79
(58) Field of Classification Search .................. 257/72, 257/79
See application file for complete search history.

(56) References Cited

U.S. PATENT DOCUMENTS

| 5,952,778 | A | 9/1999 | Haskal et al. |
| 6,268,695 | B1 | 7/2001 | Affinito |
| 6,429,584 | B2 | 8/2002 | Kubota |
| 6,501,014 | B1 * | 12/2002 | Kubota et al. ............. 136/256 |
| 6,522,067 | B1 | 2/2003 | Graff et al. |
| 6,570,325 | B2 | 5/2003 | Graff et al. |
| 6,605,826 | B2 | 8/2003 | Yamazaki et al. |
| 6,660,409 | B1 | 12/2003 | Komatsu et al. |
| 2003/0085654 | A1 | 5/2003 | Hayashi |
| 2003/0193286 | A1 * | 10/2003 | Ottermann et al. ......... 313/506 |

FOREIGN PATENT DOCUMENTS

| JP | 01-283937 A | 11/1989 |
| JP | A 7-169567 | 7/1995 |
| JP | A 10-12376 | 1/1998 |

* cited by examiner

*Primary Examiner*—Doug Menz
(74) *Attorney, Agent, or Firm*—Oliff & Berridge, PLC

(57) ABSTRACT

A method of manufacturing an electro-optical device, the electro-optical device having an electro-optical element formed by laminating a first electrode, an electro-optical layer, and a second electrode in sequence on a base body, the method of manufacturing the electro-optical device, including the steps of: forming an ultraviolet absorbing layer on the substrate by a vapor deposition method so as to cover the electro-optical element; and forming a gas barrier layer by a vapor deposition method using plasma so as to cover the ultraviolet absorbing layer.

4 Claims, 14 Drawing Sheets

ELECTRO-OPTICAL DEVICE, METHOD OF MANUFACTURING THE SAME, AND ELECTRONIC APPARATUS

BACKGROUND OF THE INVENTION

1. Field of Invention

The present invention relates to an electro-optical device, a method of manufacturing the same, and an electronic apparatus including the electro-optical device.

2. Description of Related Art

In the field of electro-optical devices, there is a need for durability enhancement against oxygen, moisture, or the like. For example, an organic EL element constituting an organic EL display is formed from an inorganic anode, (an organic hole injecting layer), an organic light-emitting layer, (an electron injecting layer) and inorganic cathode. Particularly, the electron injecting layer having a material property of easy electron emission reacts easily with moisture present in atmosphere. As a result of reacting with water, the electron injection effect is diminished and a non-light-emitting region called dark spot may be formed.

Therefore, there is a need for a sealing structure to block moisture. In the related art, a structure has been used in which a glass or metal sealing substrate to block moisture is adhered by adhesive to form a hollow structure, and moisture introduced from an adhesive end is captured by a drying agent to prevent it from reaching the element (See Japanese Unexamined Patent Application Publication No. 7-169567 and Japanese Unexamined Patent Application Publication No. 10-12376.

SUMMARY OF THE INVENTION

However, as a display becomes larger, thin and lightweight, panel structure requires a shift from a hollow structure to a solid structure to have strength resistant to external stress. Further, as the display becomes larger, it requires the use of a top emission structure in which light is emitted from an opposing side of a circuit substrate, in order to secure a sufficient area for a thin film transistor (TFT) or a wiring circuit. Accordingly, a sealing structure must be a thin transparent and lightweight, and have excellent strength. There is also a need for a structure capable of being moisture-proof without a drying agent.

Recently, a $SiO_x$, a $SiN_x$ or an $AlO_x$ thin film, called a thin film sealing, which is transparent and excellent in gas barrier property, has been studied. It is possible to form a thin film that completely blocks moisture by using a high-density plasma film-forming method (an ion plating method, an ECR plasma sputtering method, an ECR plasma CVD method, a surface wave plasma CVD method, an ICP-CVD method, or the like) with a high-density plasma source. However, there is a problem that an underlying light-emitting layer, or the like, is deteriorated under the influence of ultraviolet or plasma ions generated upon forming the film. Moreover, it is required to protect the light-emitting element or the like from such ultraviolet since the ultraviolet contained in an outer light degrades a life span of the element even upon using such an electro-optical device at outdoors places as well as during manufacturing steps.

The present invention is conceived to address the aforementioned problems. The present invention provides an electro-optical device, a method thereof, and an electronic apparatus capable of reducing or preventing an electro-optical layer or the like from being deteriorated due to a formed gas barrier layer.

In order to achieve the aforementioned, an aspect of the present invention provides a method of manufacturing an electro-optical device, the electro-optical device having an electro-optical element formed by laminating at least a first electrode, an electro-optical layer, and a second electrode in sequence on a substrate. The method of manufacturing the electro-optical device, includes forming an ultraviolet absorbing layer on the substrate by a vapor deposition method so as to cover the electro-optical element and forming a gas barrier layer by a vapor deposition method using a plasma so as to cover the ultraviolet absorbing layer.

In this manufacturing method, since an ultraviolet absorbing layer is formed in advance, prior to formation of the gas barrier layer, ultraviolet light generated when the gas barrier layer is formed, for example, by plasma CVD, is absorbed by an underlying ultraviolet absorbing layer. Accordingly, an electro-optical layer or the like, disposed beneath the underlying ultraviolet absorbing layer, is reduced or prevented from being deteriorated by light. In addition, the ultraviolet absorbing layer is excited by absorbing the ultraviolet, such that surface activation is obtained, allowing the gas barrier layer to be denser and the quality thereof to be enhanced.

Further, since the ultraviolet absorbing layer is allowed to use, for example, a vapor deposition method without a plasma and does not need to use a high-density plasma source as a plasma source to obtain a gas barrier capability, the electro-optical layer, the electrode, and the like are not damaged. Further, in case where the electro-optical device is used outdoors or the like, light resistance is enhanced in normal use, since the ultraviolet absorbing layer absorbs ultraviolet included in an external light.

Further, a variety of electro-optical materials, such as a liquid crystal or an electroluminescent (EL) material can be applied to the electro-optical layer. The electro-optical layer can be also composed of a laminated film, including a plurality of functional layers, as well as a single layer. For example, it is possible to form an EL light-emitting element as an electro-optical element by laminating a plurality of functional layers including a hole injecting layer, a hole transporting layer, an EL light-emitting layer, an electron transporting layer, and electron injecting layer, and the like, between the first electrode and the second electrode. In particular, in case of an element, such as an EL light-emitting element, that performs its function when a carrier, supplied from the first electrode or the second electrode, passes through the electro-optical layer, at least some parts of the element may have different properties, such that electrons and holes, and charge balance may be disturbed.

These portions have substantially high reactivity and generate structural defects (i.e., capture site of the carrier) by reacting with, for example, oxygen, water or the like, which causes a function degradation of the electro-optical layer. Accordingly, preparation of the gas barrier layer shows more excellent effects.

Moreover, a method of manufacturing an electro-optical device of an aspect of the present invention is characterized in that it includes forming a plurality of first electrodes on a substrate; forming, on the substrate, a bank structure having a plurality of apertures corresponding to positions at which the first electrodes are formed; forming electro-optical layers in each of the apertures in the bank structure; forming a second electrode so as to cover the bank structure and each of electro-optical layers; forming an ultraviolet absorbing layer on the substrate by a vapor deposition method so as to cover the second electrode; and forming a gas barrier layer by a vapor deposition method using a plasma so as to cover the ultraviolet absorbing layer.

This manufacturing method is a method to manufacture an electro-optical device having a plurality of electro-optical elements on a substrate, the elements being partitioned by a bank structure. Also, in this manufacturing method, light deterioration of the electro-optical element can be reduced or prevented effectively upon a step of forming a gas barrier layer and upon normal use. Further, an outer side of an electro-optical layer disposed at an outermost peripheral portion among a plurality of electro-optical layers provided on the substrate is laminated fourfold by the bank structure, the second electrode, the ultraviolet absorbing layer, and the gas barrier layer, such that the gas barrier layer reduces or prevents intrusion of oxygen or moisture. Further, if an outer side of the bank structure is in vertical or reverse tapered shape with respect to the substrate when the second electrode, the ultraviolet absorbing layer, and the gas barrier layer are formed, the electrode or the layer may be, unfortunately, cut. Accordingly, it is preferable that an angle of a face constituting the outer side of the bank structure with respect to the substrate surface be 110° or more.

In each of the manufacturing methods, the gas barrier layer may be formed using a high-density plasma under reduced pressure. Accordingly, it is possible to form a dense film having high gas barrier capability.

Further, the ultraviolet absorbing layer may include, for example, an oxide semiconductor material having an energy band gap of 2 eV to 6 eV, as a primary component. A high strength light in an ultraviolet band is generated in the forming of the gas barrier layer and the ultraviolet light generated herein may deteriorate the electro-optical layer.

Consequently, it is possible to implement deterioration reduction or prevention of the electro-optical layer and high quality of the gas barrier layer by forming the ultraviolet absorbing layer of the above-stated material as a primary component to absorb light of a wide wavelength range and to convert it to an excitation energy of a film-forming face. Further, a material having an energy band gap of less than 3 eV absorbs light in the visible light ray band from the electro-optical layer, resulting in luminance degradation of the electro-optical device, which disturbs utilization for the top emission structure. Accordingly, in case of adopting the top emission structure, it is preferable that the ultraviolet absorbing layer include an oxide semiconductor material having an energy band gap of 3 eV to 6 eV, as a primary component.

Further, the ultraviolet absorbing layer may have photocatalyst activity by ultraviolet light generated from plasma used in the forming of the gas barrier layer. In this case, a top surface of the ultraviolet absorbing layer is excited by ultraviolet or the like generated in the forming of the gas barrier layer to realize strong catalysis. Accordingly, even if impurities, such as organic substances or the like attach to the surface of the ultraviolet absorbing layer in the forming of the gas barrier layer or prior to formation of the gas barrier layer, these impurities are dissolved and removed by the catalysis so that the surface of the ultraviolet absorbing layer can be always kept clean in the forming of the gas barrier layer.

As a material having such photocatalyst activity, there is known, for example, an oxide semiconductor, such as titanium oxide ($TiO_2$), strontium titanate ($SrTiO_3$), zinc oxide (ZnO), tungsten oxide ($WO_3$), tin oxide ($SnO_2$), niobium oxide ($Nb_2O_6$), potassium tantalate ($KTaO_3$), iron oxide ($Fe_2O_3$) or the like, and the above-stated material may be used in the ultraviolet absorbing layer of an aspect of the present invention as a primary component. Further, in case where it is applied to the top emission-type structure, the ultraviolet absorbing layer may include, as a primary component, an n-type oxide particle semiconductor material of light transmittance that includes any one of titanium, zinc and tin. Thus, it is possible to enhance light-emitting efficiency by using a material having high transparency. Also, at least one element of platinum, gold, silver and copper may be contained as a cocatalyst in the ultraviolet absorbing layer in order to enhance photocatalyst activity.

In the method to manufacture the electro-optical device of an aspect of the present invention, it is possible to form the ultraviolet absorbing layer on an exposed face of the second electrode. This case may include degrading the conductivity (i.e., increase the insulating property) of the ultraviolet absorbing layer at an interface with the second electrode by making nitrogen to be contained in at least a face of the ultraviolet absorbing layer contiguous with the second electrode. Accordingly, it is possible to reduce or prevent deterioration of the electro-optical layer, which is caused by charge flow into the second electrode side, the charge being generated as the ultraviolet absorbing layer is excited by light.

Further, in a case where an oxide semiconductor is used in the ultraviolet absorbing layer, at least a face of the second electrode contiguous with the ultraviolet absorbing layer may be formed of an inorganic oxide. Accordingly, since visible light transmittance is given to correspond to the top emission, it is possible to increase close adherence between the ultraviolet absorbing layer, including an oxide semiconductor as a primary component, and the second electrode.

Further, in the above-mentioned method, the forming of the second electrode to the forming of the gas barrier layer may be continuously performed under reduced pressure by a vapor deposition method. Thus, since the respective layers are continuously formed under reduced pressure without returning to the atmospheric pressure, impurities can be reduced or prevented from being incorporated therein and rapid processing can be realized.

Further, in the method to manufacture the electro-optical device of an aspect of the present invention, it is preferable to form a buffer layer may be formed to planarize an underlying uneven shape (e.g., an uneven shape formed by the bank structure) between the second electrode and the ultraviolet absorbing layer. Thus, by planarizing the substrate prior to forming the gas barrier layer, such external stress from the substrate side can be dispersed, thus reducing or preventing cracks from being generated in the gas barrier layer and the ultraviolet absorbing layer. That is, since the gas barrier thin film has a moisture blocking property, it is a dense and extremely rigid film. If there are irregularities or steep steps on the surface, external stress is concentrated thereon, which causes cracking or peeling of the films. Accordingly, it is necessary to add a buffer layer, considering close adherence or flatness. Furthermore, in order to absorb stress from the substrate side, a material having some flexibility may be used as a material of the buffer layer and, for example, an organic material is preferable.

In the method, the buffer layer may be formed by a liquid phase method. By doing so, it is possible to easily form a film having good flatness. Further, in this case, an electrode protecting layer may be formed to protect the second electrode between the second electrode and the buffer layer in order to reduce or prevent the second electrode from being exposed to atmosphere or an organic solvent upon forming the buffer layer. A silicon compound, such as silicon oxide, silicon nitride, and silicon oxynitride may be used as a material of the electrode protecting layer. In particular, silicon nitride or silicon oxynitride, which contains nitrogen, allows obtaining good close adherence with the second electrode composed of an oxide semiconductor or the like, and forms a dense film, thereby obtaining better barrier properties against oxygen or moisture.

Further, in the above-stated method, a buffer layer may be formed protecting layer between the buffer layer and the ultraviolet absorbing layer. Accordingly, the buffer layer can be reduced or prevented from being deteriorated by formation of the ultraviolet absorbing layer or the gas barrier layer. Further, since the buffer layer is easily damaged by excited electrons when the ultraviolet absorbing layer has photocatalyst activity, an insulating material capable of blocking the exited electrons may be used as a material of the buffer layer protecting layer. Specifically, a silicon compound or the like may be used.

Moreover, in the method of manufacturing the electro-optical device of an aspect of the present invention, the gas barrier layer may be formed of a silicon compound, such as silicon oxide, silicon nitride, silicon oxynitride or the like. In particular, silicon nitride or silicon oxynitride, which contains nitrogen, makes it possible to obtain good close adherence with the second electrode composed of an oxide semiconductor or the like, and forms a dense film, thereby obtaining better barrier properties against oxygen or moisture. In addition, there is an effect that electric leakage is also reduced or prevented upon electric conduction by silicon nitride or silicon oxynitride having an excellent insulating property.

Further, the ultraviolet absorbing layer may have a layer thickness of 10 nm or more, in order to assure that the ultraviolet absorbing layer absorbs light. Further, a laminated film of the ultraviolet absorbing layer and the gas barrier layer may have a layer thickness of 500 nm or less so that transparency of a light drawing side is not degraded when it is a top emission-type electro-optical device, with the second electrode being used as a transparent electrode and a display light passing through the gas barrier layer.

The electro-optical device of an aspect of the present invention is fabricated by the above-stated manufacturing methods, and is characterized in that a first electrode, an electro-optical layer, a second electrode, an ultraviolet absorbing layer, and a gas barrier layer are laminated in this order on a substrate.

According to the configuration, it is possible to enhance light resistance by absorbing ultraviolet included in an external light by the ultraviolet absorbing layer when it is used at the outdoors, thus obtaining long-term life span of the device along with enhancing water resistance and oxygen resistance by the gas barrier layer.

In such an electro-optical device, the electro-optical layer and the electrode or the like, may be protected by providing a protecting layer on the gas barrier layer. The protecting layer may be a surface protecting layer having functions, such as pressure resistance, wear resistance, a light reflection blocking property, a gas barrier property, ultraviolet shielding property or the like. Thus, it is possible to protect the ultraviolet absorbing layer or the gas barrier layer, as well as the electro-optical layer or the electrode.

Further, the protecting layer may have a buffer layer which closely adheres to the gas barrier layer while having a buffering function against mechanical shock. Thus, it is possible to increase shock resistance of the device by mitigating mechanical shock by means of the provided buffer layer.

Further, an electronic apparatus of an aspect of the present invention includes the above-stated electro-optical device.

Accordingly, it is possible to provide an electronic apparatus having excellent water resistance, oxygen resistance and light resistance.

DETAILED DESCRIPTION OF EXEMPLARY EMBODIMENTS

First Exemplary Embodiment

An electro-optical device according to a first exemplary embodiment of the present invention will be described with reference to FIGS. 1 to 10.

First of all, an EL display device using an organic electroluminescent (EL) material as an example of an electro-optical device to which a manufacturing method of an aspect of the present invention is applied will be described prior to describing a method of manufacturing an electro-optical device of an aspect of the present invention.

A wiring structure of the EL display device in this example will be described with reference to FIG. 1.

Figure 1:
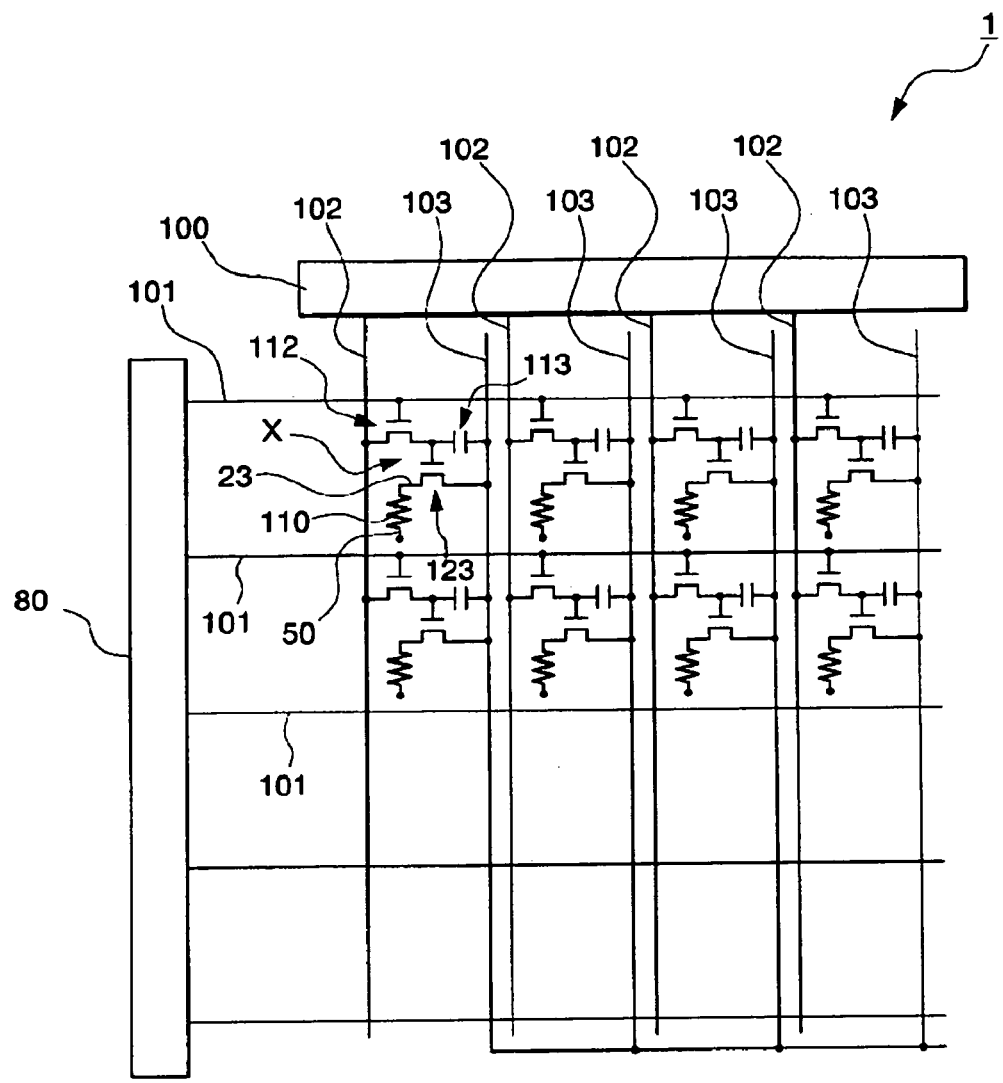
FIG. 1 is a schematic showing a wiring structure of an electro-optical device according to a first exemplary embodiment of the present invention.

The EL display device (i.e., electro-optical device) 1 shown in FIG. 1 is an active matrix type EL display device using a thin film transistor (hereinafter, "TFT") as a switching element.

This EL display device 1, as shown in FIG. 1, includes a plurality of scan lines 101, a plurality of signal lines 102 extended in a crossing direction perpendicular to respective scan lines 101, and a plurality of power lines 103 extended in parallel with respective signal lines 102. A pixel region X is provided at the vicinity of each crossing point between the scan line 101 and the signal line 102.

A data line driving circuit 100 is coupled to the signal line 102 and includes a shift register, a level shifter, a video line and an analog switch. Further, a scan line driving circuit 80, including a shift register and a level shifter, is coupled to the scan line 101.

Each of the pixel regions X includes a switching TFT 112, the gate electrode of which is supplied with a scan signal via the scan line 101; a holding capacitance 113 to hold a shared pixel signal from the signal line 102 via the switching TFT 112; a driving TFT 123, the gate electrode of which is supplied with the pixel signal held by the holding capacitance 113; a pixel electrode (electrode) 23 into which a driving current from the power line 103 flows upon being electrically connected to the power line 103 via the driving TFT 123; and an electro-optical layer 110 interposed between the pixel electrode 23 and a cathode (electrode) 50. The pixel electrode 23, the cathode 50 and the electro-optical layer 110 make up a light-emitting element (organic EL element).

According to the EL display device 1, if the scan line 101 is driven and the switching TFT 112 is turned on, a potential at the signal line 102 is then held in the holding capacitance 113 and an ON or OFF state of the driving TFT 123 is determined depending on the state of the holding capacitance 113. Also, a current flows from the power line 103 into the pixel electrode 23 via the channel of the driving TFT 123 and, again, a current is flows into the cathode 50 via the electro-optical layer 110. The electro-optical layer 110 emits light depending on the amount of the current therethrough.

Next, a detailed configuration of the EL display device 1 in this example will be described with reference to FIGS. 2 to 5.

Figure 2:
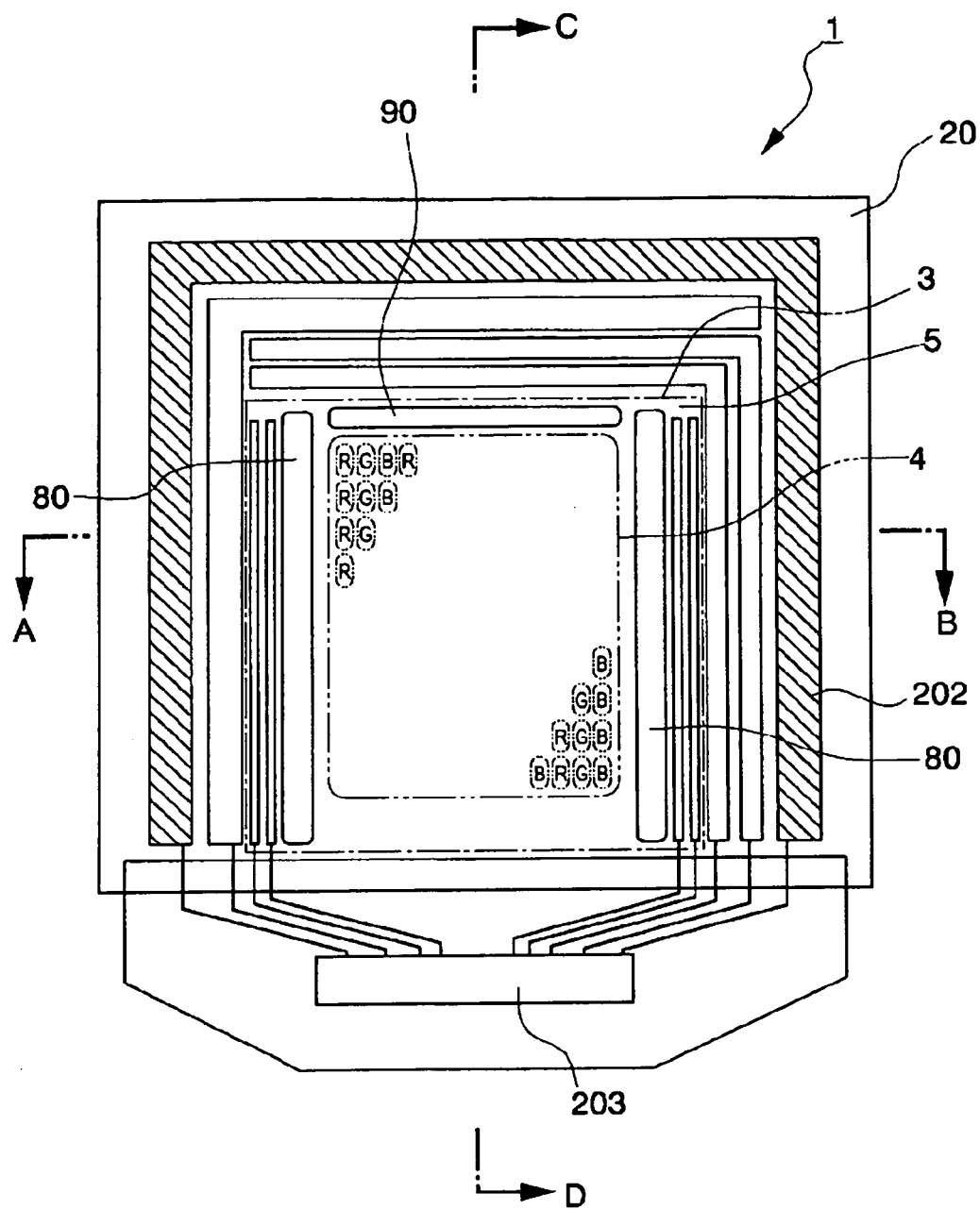
FIG. 2 is a schematic showing a configuration of the electro-optical device.

As shown in FIG. 2, the EL display device 1 in this example is an active matrix type device, including a substrate 20 having an electrical insulating property, a pixel electrode region (not shown) in which pixel electrodes, connected to switching TFTs (not shown), are disposed in a matrix form on the substrate 20, power lines (not shown) disposed around the pixel electrode region and connected to the respective pixel electrodes, and a pixel portion 3 (inside a portion indicated by one-dotted chain line of FIG. 2) that is of substantially rectangular shape when seen from a plane positioned on at least the pixel electrode region. Further, in an aspect of the present invention, the substrate 20, and a switching TFT, various circuits, an interlayer insulating film, and the like formed on the substrate, as described below, is referred collectively to as a base body (a reference numeral 200 of FIGS. 3 and 4).

The pixel portion 3 is divided into an effective display region 4 in a center portion (inside a portion indicated by two-dotted chain line of FIG. 2) and a dummy region 5 disposed around the effective display region 4 (a region between the one-dotted chain line and the two-dotted chain line).

In the effective display region 4, display regions R, G and B, each having the pixel electrode, are disposed in the matrix form with spaces in the A-B direction and the C-D direction.

Scan line driving circuits 80 and 80 are disposed at both sides of the effective display region 4 in FIG. 2.

These scan line driving circuits 80 and 80 are disposed at lower sides of the dummy region 5.

In addition, a checking circuit 90 is disposed at an upper side of the effective display region 4 in FIG. 2. This checking circuit 90 is a circuit to check an operational situation of the EL display device 1, including, for example, a check information output device (not shown) to output a check result to the exterior, so that the circuit checks quality and defect of a display device during manufacture or upon shipment. This checking circuit 90 is also disposed at a lower side of the dummy region 5.

Figure 3:
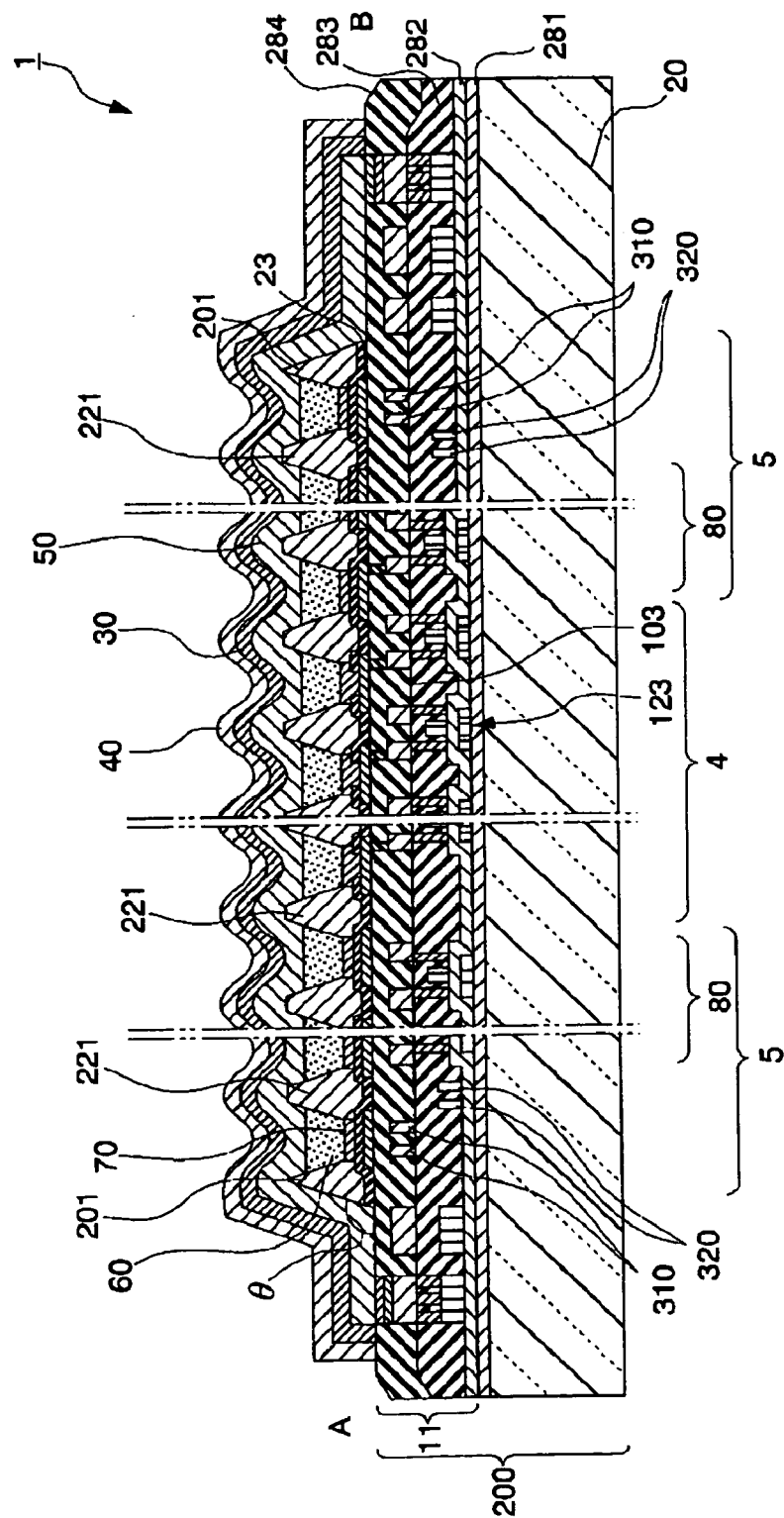
FIG. 3 is a sectional view taken along a plane A-B of FIG. 2.
Figure 4:
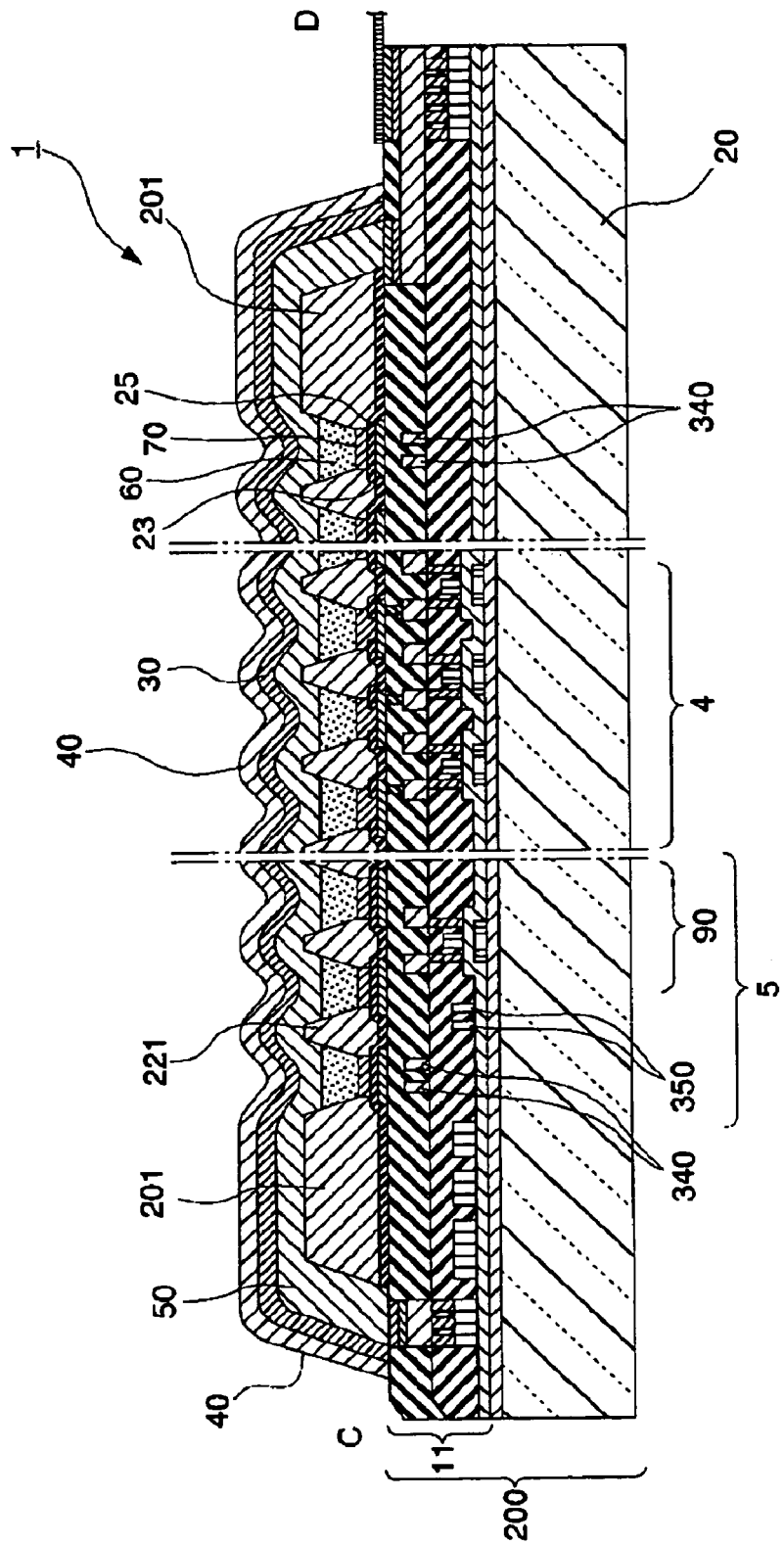
FIG. 4 is a sectional view taken along a plane C-D of FIG. 2.

The scan line driving circuit 80 and the checking circuit 90 are configured so as to be supplied with a driving voltage from a given power supply portion through a driving voltage continuity part 310 (see FIG. 3) and a driving voltage continuity part 340 (see FIG. 4). Further, a driving control signal and a driving voltage for the scan line driving circuit 80 and the checking circuit 90 are adapted to be sent and applied via a driving control signal continuity part 320 (see FIG. 3) and a driving voltage continuity part 350 (see FIG. 4) in a predetermined main driver or the like, to perform an operation control of the EL display device 1. The driving control signal in this case is an instruction signal from a main driver or the like, associated with a control at the time when the scan line driving circuit 80 and the checking circuit 90 output a signal.

Further, the EL display device 1, as shown in FIGS. 3 and 4, includes a plurality of light-emitting elements (organic EL elements), and an ultraviolet absorbing layer 30 and a gas barrier layer 40, laminated in sequence in order to cover the light-emitting elements. Each of the light-emitting elements includes a pixel electrode (a first electrode) 23, a light-emitting layer (electro-optical layer) 60, and a cathode (the second electrode) 50 on the base body 200.

Although only the light-emitting layer 60 has been shown as an electro-optical layer in FIGS. 3 and 4, the electro-optical layer can be composed of a laminated film including a plurality of laminated layers, rather than such a single layer. In practice, in this exemplary embodiment, the electro-optical layer is composed of a laminated film including a carrier injecting layer or a carrier transporting layer, such as a hole injecting layer, a hole transporting layer, an electron injecting layer or an electron transporting layer; a hole blocking layer, an electron blocking layer and the light-emitting layer, as described below.

In case of a so-called top emission-type EL display device, since it has a configuration to draw out a display light from the gas barrier layer 40 being an opposing side of the substrate 20, a transparent substrate and an opaque substrate can be all used as the substrate body 20 making up the base body 200. The opaque substrate includes, for example, ceramics, such as alumina, or metal sheet, such as stainless steel which is subjected to insulating, such as surface oxidation, thermosetting resin, thermoplastic resin, a film thereof (plastic film), or the like.

Further, in case of a so-called bottom emission-type EL display device, since it has a configuration to draw out a display light from the substrate 20, a transparent or opaque substrate is adopted as the substrate 20. For example, there are glass, quartz, resin (plastic and plastic film), or the like. In particular, a glass substrate is desirably used. This exemplary embodiment adopts a top emission-type configuration in which emitted light is drawn out from the gas barrier layer 40 side.

Figure 5:
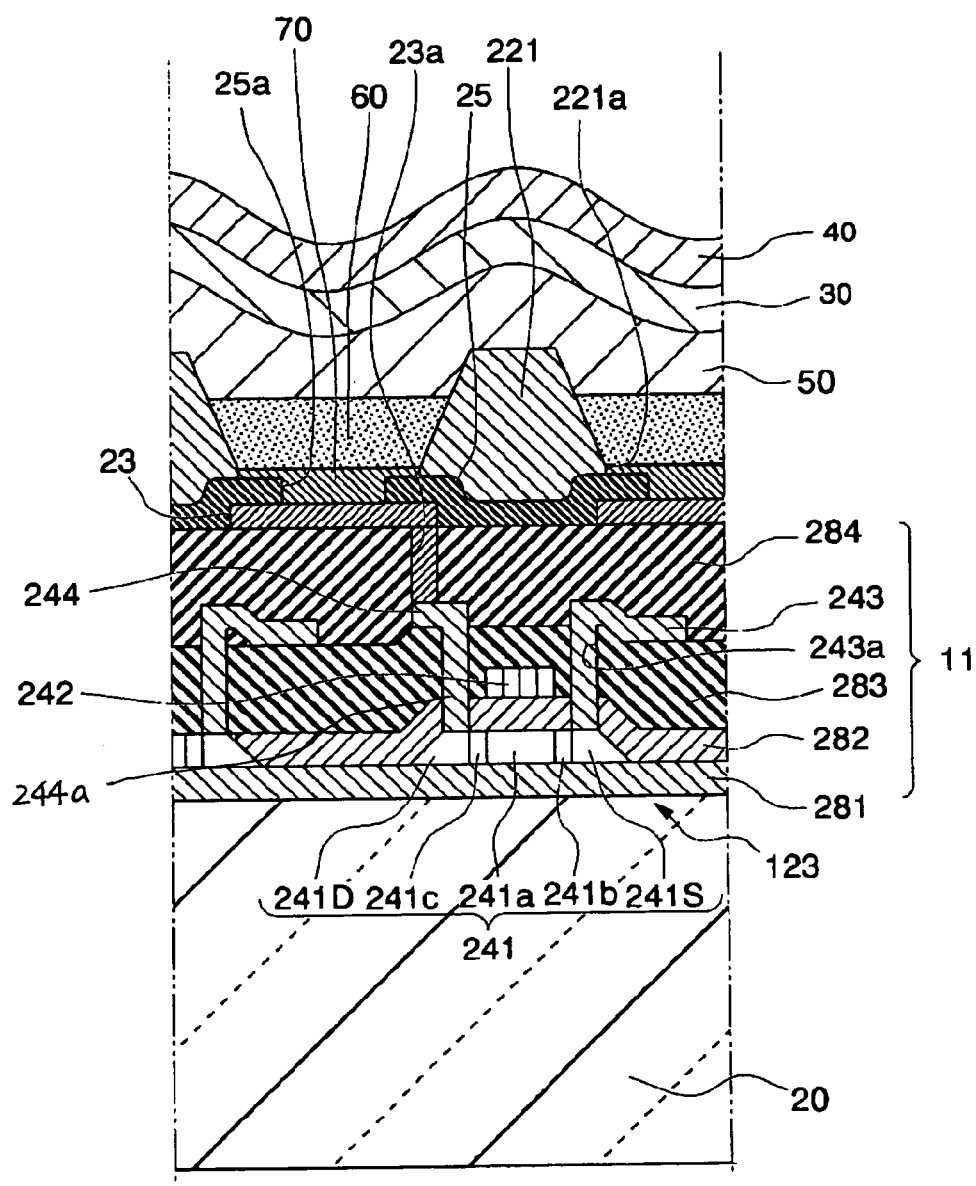
FIG. 5 is an enlarged sectional view of primary portions of FIG. 3.
Figure 6:
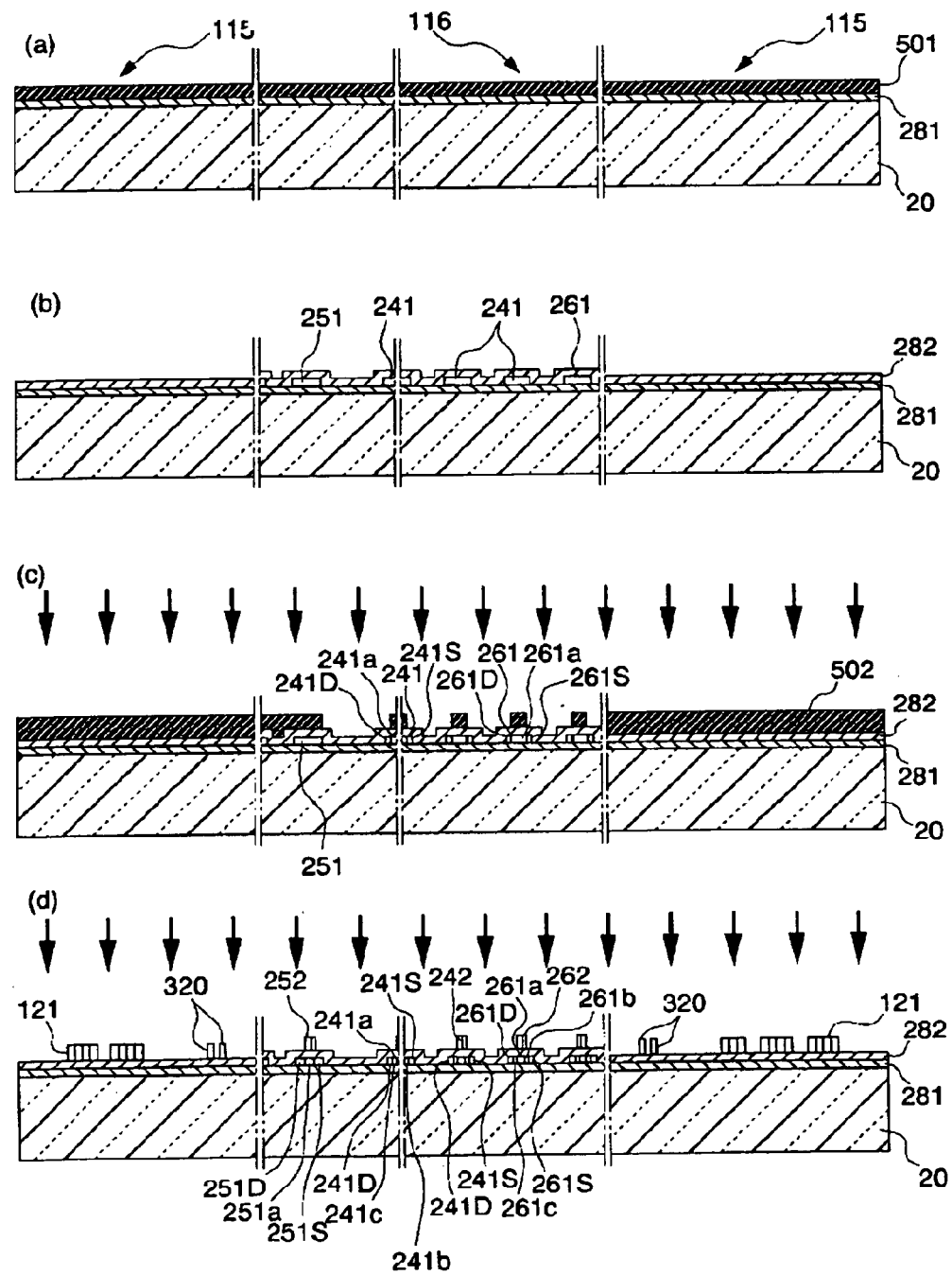
FIG. 6 is a sectional view for explaining a method to manufacture an electro-optical device in step sequence.
Figure 7:
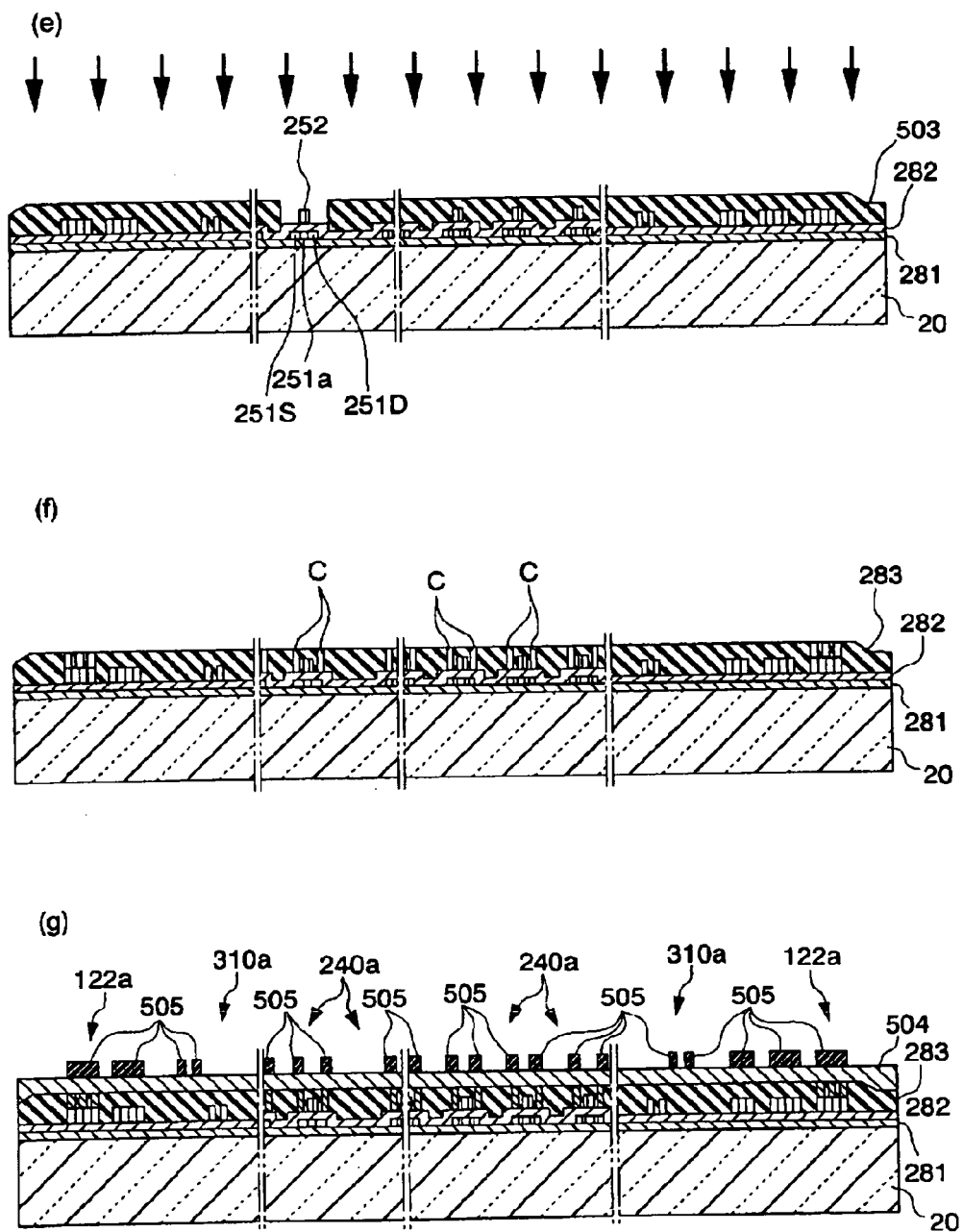
FIG. 7 is a sectional view to explain a step subsequent to FIG. 6.
Figure 8:
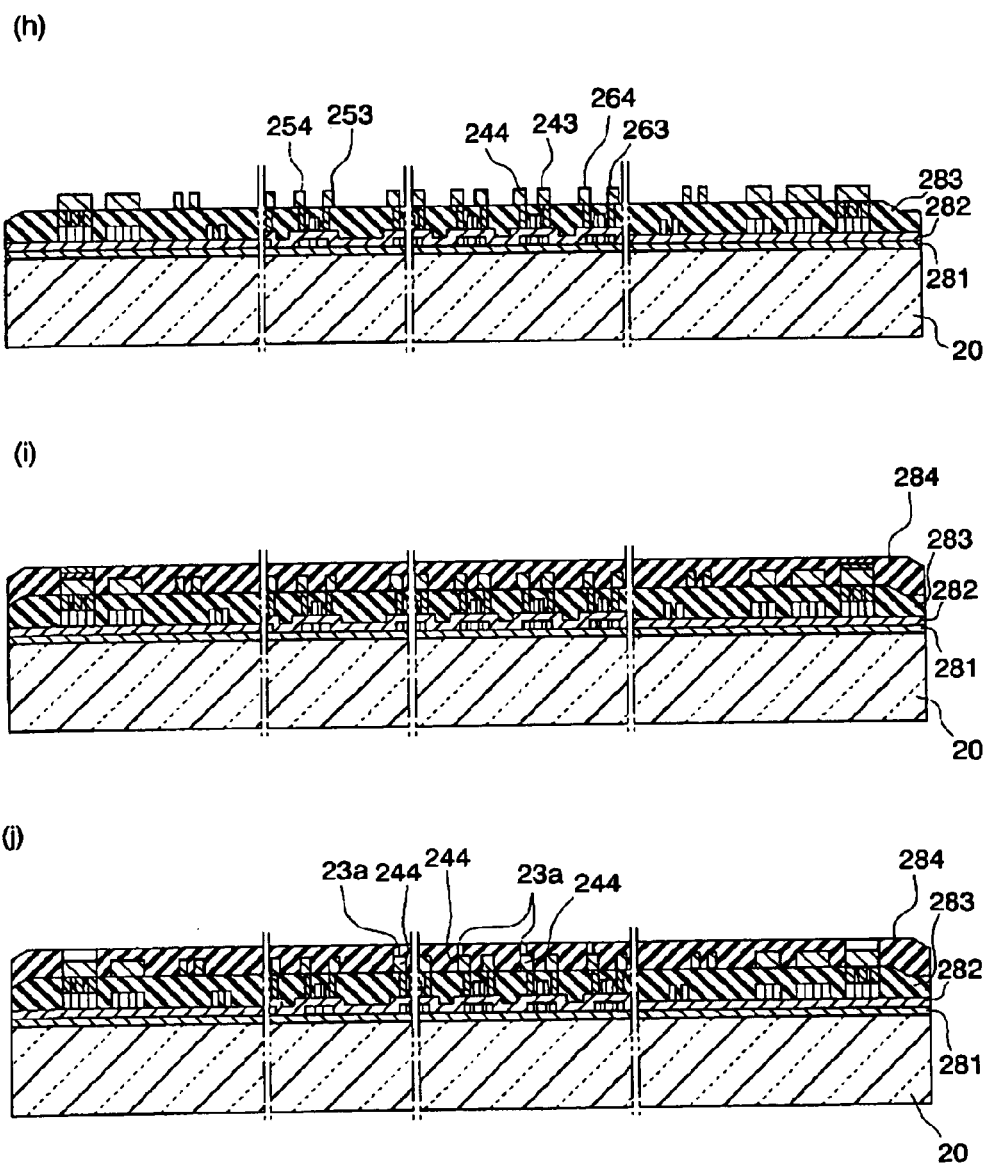
FIG. 8 is a sectional view to explain a step subsequent to FIG. 7.
Figure 9:
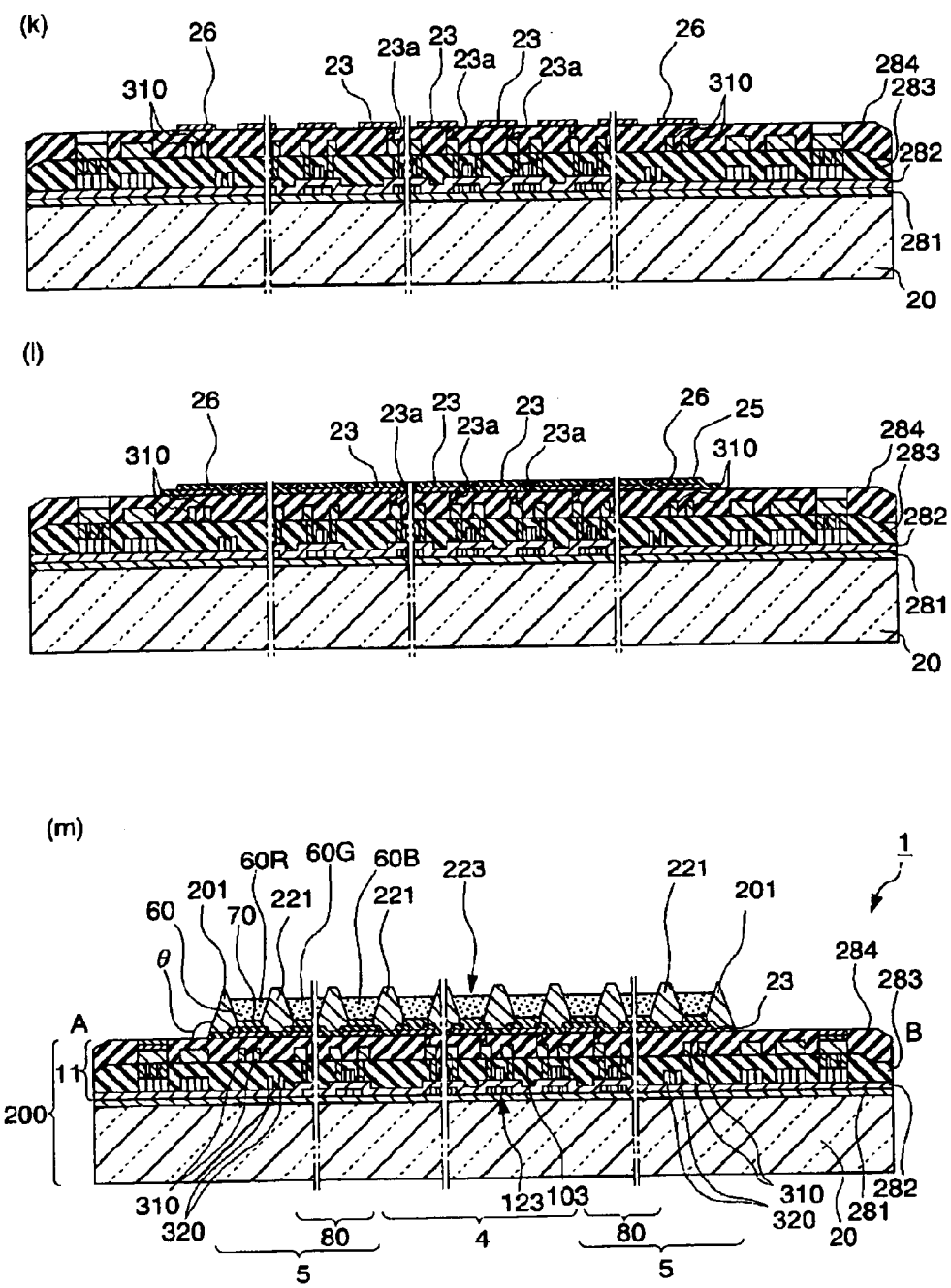
FIG. 9 is a sectional view to explain a step subsequent to FIG. 8.
Figure 10:
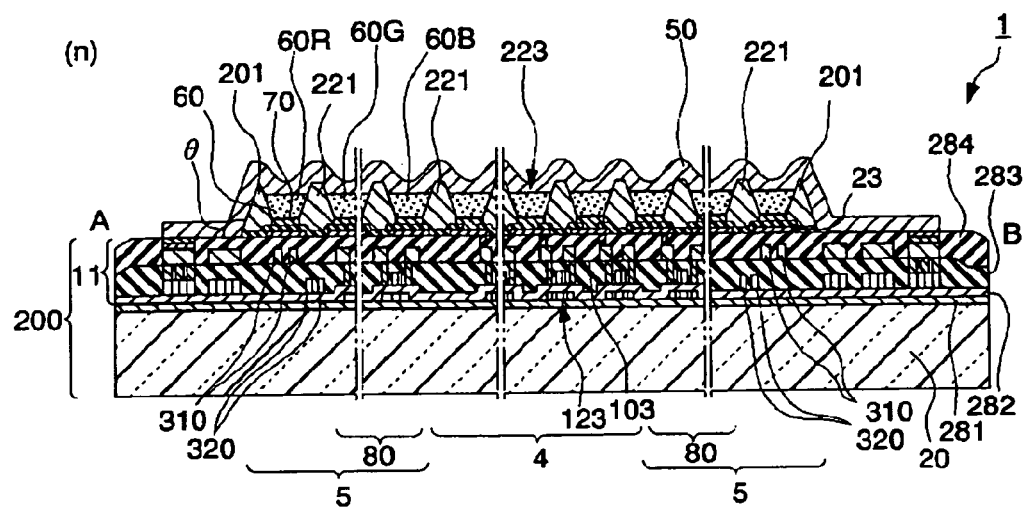
FIG. 10 is a sectional view to explain a step subsequent to FIG. 9.
Figure 10:
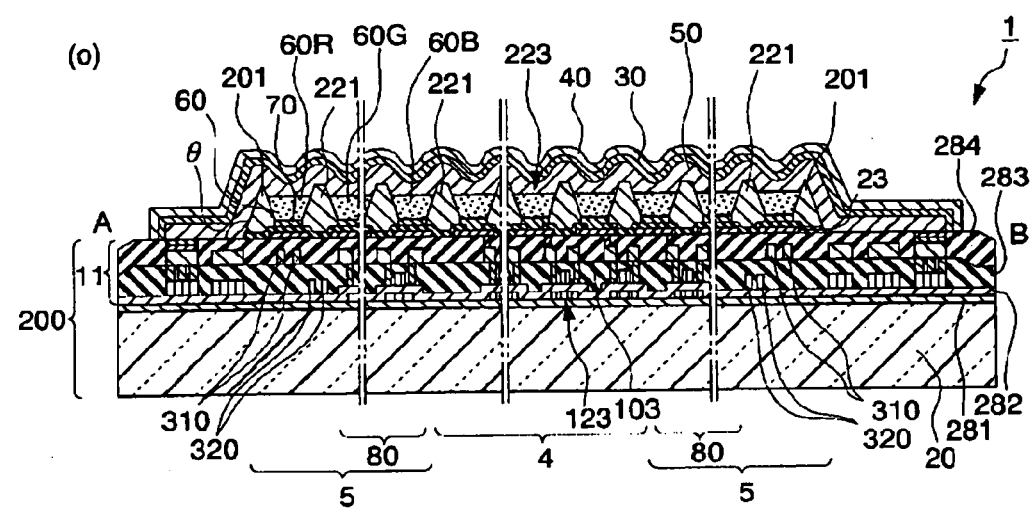

A circuit portion 11 is formed on the substrate 20 and includes a driving TFT 123 to drive the pixel electrode 23 or the like, and a number of light-emitting elements (organic EL elements) are disposed thereon. The light-emitting element, as shown in FIG. 5, is composed of a pixel electrode (a first electrode) 23 functioning as an anode, a hole transporting layer 70 to inject and transport a hole generated from the pixel electrode 23, a light-emitting layer 60 including an organic EL material as one of electro-optical materials, and a cathode (a second electrode) 50, which are formed in sequence.

Under this configuration, the light-emitting element emits light by combining holes injected from the hole transporting layer 70 with electrons from cathode 50 in the light-emitting layer 60.

Since the pixel electrode 23 in this example is of the top emission-type, it is not required to be transparent. Accordingly, the pixel electrode is formed from a suitable conductive material.

For example, a poly thiophene derivative, a polypyrrole derivative or the like, or a body doped with them or the like, is used as a material for formation of the hole transporting layer 70. Specifically, 3,4-polyethylenedioxythiophene/polystyrene sulfonic acid (PEDOT/PSS) or the like, is used.

It is possible to use a known light-emitting material capable of emitting a fluorescent or phosphorescent light as a material to form the light-emitting layer 60. Specifically, (poly)fluorene derivative (PF), (poly)paraphenylenevinylene derivative (PPV), polyphenylene derivative (PP), polyparaphenylene derivative (PPP), polyvinylcarbazole (PVK), polythiophene derivative, a polysilane-based material such as polymethylphenyl silane (PMPS) may be used.

Further, these high-molecular weight materials can be used by being doped with high-molecular weight-based material, such as perylene-based pigment, coumarin-based pigment, and rhodamine-based pigment, or low-molecular weight material, such as rubrene, perylene, 9,10-diphenylanthracene, tetraphenylbutadiene, nile red, coumarin 6, and quinacridon.

A low-molecular weight material, as known in the related art, may be used in place of the above-described high-molecular weight material.

Further, an electron injecting layer may be, if necessary, formed on such a light-emitting layer 60.

As shown in FIGS. 3 to 5, the hole transporting layer 70 and the light-emitting layer 60 in this exemplary embodiment are placed on the base body 200 in such a state that the layers are partitioned by a bank structure composed of a lyophilic property controlling layer 25 and an organic bank layer 221. That is, the lyophilic property controlling layer 25 and the organic bank layer 221 have apertures at positions corresponding to the respective pixel electrodes 23 arranged in a matrix form on the base body 200. The hole transporting layer 70 and the light-emitting layer 60 are disposed in the respective apertures. Further, in the lyophilic property controlling layer 25 and the organic bank layer 221 formed in a lattice shape, particularly, a portion of covering and surrounding a portion forming the outermost peripheral part, namely, an outer side of the outermost peripheral part of the light-emitting layer 60 is a surrounding member 201. Also, a substantially rectangular region surrounded by the surrounding member 201 is the effective display region 4.

Here, for the surrounding member 201, an angle θ of a face 201a, which forms an outer side in the organic bank layer 221 forming a upper portion of the surrounding member, with respect to the surface of the base body 200, is 110° or more. The reason of setting such an angle is to make step coverage of the cathode 50 and the gas barrier layer 40 formed thereon to be excellent, and to secure continuity of the cathode or the gas barrier layer 40 on an outer side, as described below.

The cathode 50, as shown in FIGS. 3 to 5, includes a larger area than an aggregate area of the effective display region 4 and the dummy region 5 to cover each of the regions. The cathode is formed on the base body 200 so as to cover the surfaces of the light-emitting layer 60, the organic bank layer 221 and the surrounding member 201, and the face 201a forming an outer side of the surrounding member 201. Further, the cathode 50, as shown in FIG. 4, is connected to a cathode wiring 202 formed in the outer peripheral portion of the base body 200 at the outer side of the face 201a of the surrounding member 201. Since a flexible substrate 203 is connected to this cathode wiring 202, the cathode 50 is connected via the cathode wiring 202 to a driving IC (driving circuit), not shown, on the flexible substrate 203.

A transparent conductive material is used as the material to form the cathode 50, since this example is of a top emission-type needing light transmittance. Although it is preferable that the transparent conductive material is ITO (indium tin oxide), it is possible to use, for example, indium oxide, zinc oxide-based amorphous transparent conductive film (Indium Zinc Oxide; IZO, Idemitsu Kosan Co. Ltd.), AZO (aluminum zinc oxide), or the like. This example uses ITO.

An ultraviolet absorbing layer 30 is provided on the cathode 50 to cover a portion of the cathode 50 that has been exposed on the base body 200.

The gas barrier layer 40 is to reduce or prevent oxygen or moisture from penetrating into underlying layers thereof. Accordingly, invasion of oxygen or moisture into the cathode 50 or the light-emitting layer 60 is reduced or prevented, and deterioration or the like of the cathode 50 or the light-emitting layer 60 due to the oxygen or the moisture is suppressed. The gas barrier layer 40, as described below, is formed by a reduced pressure vapor deposition method (sputtering, plasma CVD or the like) using high-density plasma at a low temperature.

The gas barrier layer 40 is composed of an inorganic compound. Preferably, it is formed from a silicon compound, for example silicon nitride or silicon oxynitride, silicon oxide, or the like. By forming the gas barrier layer 40 of a silicon compound, the gas barrier layer 40 becomes dense, thereby obtaining excellent gas barrier capability.

Meanwhile, the ultraviolet absorbing layer 30 is adapted to absorb light, such as ultraviolet light generated when the gas barrier layer 40 is formed, and to reduce or prevent light deterioration of the light-emitting layer 60. Accordingly, a semiconductor material having an energy band gap corresponding to the above-mentioned wavelength of the light is used in the ultraviolet absorbing layer 30. Further, because a high intensity of light is generated in the forming of the gas barrier layer, there is a concern that although the light generated herein is, for example, light, such as infrared rays or visible light rays, other than an ultraviolet, it deteriorates the light-emitting layer 60. Accordingly, in this exemplary embodiment, the ultraviolet absorbing layer 30 is formed of materials including, as a primary component, a semiconductor material having, for example, an energy band gap from 2 eV to 6 eV, to make the ultraviolet absorbing layer 30 absorb light of wide wavelength range, thereby reducing or preventing deterioration of the light-emitting layer 60.

At this time, in the top emission-type structure as in this exemplary embodiment, since the ultraviolet absorbing layer 30 should have transparency to a visible light ray (e.g., light having the wavelength range of 400 nm to 700 nm), it is necessary to select, as the semiconductor material, a material having an absorption wavelength area only in the ultraviolet band. Specifically, a semiconductor material having an energy band gap from 3 eV to 6 eV is desirable. Some of the visible light ray (blue light or the like) is blocked by the material having the energy band gap of 3 eV or less, while light in the ultraviolet band of 413 nm or less, is selectively absorbed by the material of 3 eV or more. It does not disturb luminescence of blue light of about 430 nm. Since a material of 6 eV or more cannot block ultraviolet lights of 200 nm to 400 nm, there is no effect. In a bottom emission-type structure in which display light is drawn from the substrate body 20 side, since the ultraviolet absorbing layer 30 does not have to have transparency in the visible light ray range, it does not matter that a material having an absorption wavelength region in the infrared region or in the visible light ray region (i.e., semiconductor material having an energy band gap from 2 eV to 6 eV) is used as the semiconductor material. Further, in order to ensure the light absorption, the ultraviolet absorbing layer 30 may have a layer thickness of 10 nm or more.

Further, this exemplary embodiment adopts the semiconductor material having photocatalyst activity, as a primary component of the ultraviolet absorbing layer 30, not to simply absorb the light but to positively use the light as energy to clean the surface of the ultraviolet absorbing layer 30 by this ultraviolet light energy. For example, some known n-type oxide semiconductor materials, as shown in Table 1 below, can be used as a material having photocatalyst activity. Among them, because $TiO_2$ has excellent chemical stability, it is suitable for the ultraviolet absorbing layer 30. Further, to increase photocatalyst activity, at least one element of platinum (Pt), gold (Au), silver (Ag), and copper (Cu) may be included as a cocatalyst in the ultraviolet absorbing layer 30.

TABLE 1

| Semiconductor material | Energy band gap (eV) | Light wavelength needed for excitation (nm) |
| --- | --- | --- |
| Titanium oxide ($TiO_2$) | 3.2 | 388 |
| Strontium titanate ($SrTiO_3$) | 3.2 | 388 |
| Zinc oxide (ZnO) | 3.2 | 388 |
| Tin oxide ($SnO_2$) | 3.5 | 354 |
| Niobium oxide ($Nb_2O_5$) | 3.4 | 365 |
| Indium oxide ($In_2O_3$) | 3.8 | 326 |
| Potassium oxide ($Ga_2O_3$) | 4.9 | 253 |

Thus, when a photocatalyst activity material is used in the ultraviolet absorbing layer 30, the ultraviolet absorbing layer 30 is excited by ultraviolet or the like generated from high-density plasma used in forming of the gas barrier layer 40 to thereby show strong catalysis. Accordingly, even though impurities, such as organic substances, attach to the surface of the ultraviolet absorbing layer 30 during or prior to the forming of the gas barrier layer, the surface of the ultraviolet absorbing layer 30 is always maintained clean during the forming of the gas barrier layer since the impurities can be dissolved and removed by the catalysis.

Further, since this exemplary embodiment is configured to be of the top emission-type, it is required that the laminated film, including the ultraviolet absorbing layer 30 and the gas barrier layer 40, has transparency (e.g., light transmittance ratio of 80% or more in the visible light ray region). Accordingly, it is preferable that the laminated film of the ultraviolet absorbing layer 30 and the gas barrier layer 40 may have a layer thickness of, for example, 500 nm or less.

The circuit portion 11, as shown in FIG. 5, is provided at a lower portion of the light-emitting element. This circuit portion 11 is formed on the substrate 20 to make up the base body 200. An underlying protecting layer 281, including $SiO_2$ as a primary component, is formed on a surface of the substrate 20 and a silicon layer 241 is formed thereon. A gate insulating layer 282, having $SiO_2$ and/or $SiN_x$ as a primary component, is formed on the surface of the silicon layer 241.

Further, a region in the silicon layer 241 overlapped on the gate electrode 242 with the gate insulating layer 282 placed therebetween is a channel region 241a. Further, the gate electrode 242 is a portion of the scan line 101, not shown. A first interlayer insulating layer 283, including $SiO_2$ as a primary component, is formed on a surface of the gate insulating layer 282, which covers the silicon layer 241 and on which the gate electrode 242 is formed.

A low concentration source region 241b and a high-concentration source region 241S are provided at the source side of the channel region 241a in the silicon layer 241 while a low concentration drain region 241c and a high-concentration drain region 241D are provided at the drain side of the channel region 241a, such that a so-called LDD (Light Doped Drain) structure is obtained. Of them, the high-concentration source region 241S is connected to the source electrode 243 through a contact hole 243a opened through the gate insulating layer 282 and the first interlayer insulating layer 283. This source electrode 243 constitutes a portion of the above-stated power line 103 See FIG. 1. The power line 103 is extended to a position of the source electrode 243 perpendicular to the drawing sheet in FIG. 5. The high-concentration drain region 241D is connected to the drain electrode 244, formed on the same layer as the source electrode 243, through a contact hole 244a opened through the gate insulating layer 282 and the first interlayer insulating layer 283.

An upper side of the first interlayer insulating layer 283, in which the source electrode 243 and the drain electrode 244 are formed, is covered with a second interlayer insulating layer 284 formed of, for example, a silicon compound, such as silicon oxide or silicon nitride. The second interlayer insulating layer 284 may have a two-layer structure with a resin layer, such as acryl resin, considering the effect of planarizing the wiring or the like. Alternatively, by coating the surface and sides thereof with a silicon compound having high gas barrier property (particularly, silicon nitride or silicon oxynitride), it is possible to reduce or prevent oxygen, moisture, or the like from penetrating from the substrate side into the light-emitting layer 60 even when the substrate body 20 is formed of a high resin substrate having high moisture transmissivity. In particular, in this exemplary embodiment, a gas barrier layer 40 composed of a nitrogen compound is formed on the base body 200 so as to cover the bank structure and the cathode 50 and also to contact with the second interlayer insulating film 284 composed of a silicon compound, as described below. Thus, the upper layer, lower layer and side portions of the light-emitting element portion are all surrounded by the silicon compound by forming the second interlayer insulating film 284 of the silicon compound having high gas barrier property, thereby significantly enhancing moisture resistance or oxygen resistance of the device.

A pixel electrode 23 of ITO is also formed on the surface of this second interlayer insulating layer 284, and is connected to the drain electrode 244 through the contact hole 23a provided in the second interlayer insulating layer 284. The pixel electrode 23 is connected to the high-concentration drain region 241D of the silicon layer 241 via the drain electrode 244.

TFT (TFT for the driving circuit) included in the scan line driving circuit 80 and the checking circuit 90, specifically, an N channel type or P channel type TFT making up, for example, an inverter included in the shift register of these driving circuits has the same structure as that of the driving TFT 123 except that it is not connected to the pixel electrode 23.

A bank structure, including the pixel electrode 23, the lyophilic property controlling layer 25 and the organic bank layer 221, is provided on the surface of the second interlayer insulating layer 284 in which the pixel electrode 23 is formed.

The lyophilic property controlling layer 25 includes, for example, a lyophilic material, such as $SiO_2$ as a primary component, and the organic bank layer 221 is composed of acryl, polyimide, or the like. The hole transporting layer 70 and the light-emitting layer 60 are laminated in this order on the pixel electrode 23 inside an opening 25a provided in the lyophilic property controlling layer 25 and inside an opening 221a surrounded by the organic bank 221. Further, the "lyophilic" material in the lyophilic property controlling layer 25 of this example refers to a material having higher lyophilic property, at least compared to acryl or polyimide, which constitutes the organic bank layer 221.

The above-described layers up to the second interlayer insulating layer 284 on the substrate 20 make up the circuit portion 11.

Here, in the EL display device 1 of this example, the respective light-emitting layers 60 have light-emitting wavelength bands corresponding to three primary colors of light in order to display colors. For example, a red light-emitting layer 60 R having a light-emitting wavelength band corresponding to the red color, a green light-emitting layer 60 G having a light-emitting wavelength band corresponding to the green color, and a blue organic EL layer 60 B having a light-emitting wavelength band corresponding to the blue color are provided, as the light-emitting layers 60, in the corresponding display regions R, G and B, respectively, to form one pixel for color display. Further, a BM (black matrix) (not shown) formed by sputtering a metal chromium or the like at the boundaries between the respective color display regions, for example, between the organic bank layer 221 and the lyophilic property controlling layer 25.

Next, an example of a method to manufacture the EL display device 1 will be described as an exemplary embodiment of the present invention with reference to FIGS. 6 to 10. In this exemplary embodiment, a case where an EL display device 1 as an electro-optical device is of a top emission-type will be described. Each sectional view shown in FIGS. 6 to 10 corresponds to a sectional view taken along a plane A-B in FIG. 2.

First, as shown in FIG. 6(a), an underlying protecting layer 281 is formed on the surface of the substrate 20. Then, an amorphous silicon layer 501 is formed on the underlying protecting layer 281 using an ICVD method, a plasma CVD method or the like and, thereafter, crystal particles are grown by a laser annealing method or a rapid heating method to form a polysilicon layer.

Next, as shown in FIG. 6(b), the polysilicon layer is patterned by a photolithographic method to form island shaped silicon layers 241, 251 and 261. The silicon layer 241 of them is formed within the display region to make up a driving TFT 123 connected to the pixel electrode 23. The silicon layers 251 and 261 make up P channel type and N channel type TFTs (driving circuit TFTs), which are included in the scan line driving circuit 80, respectively.

Subsequently, a gate insulating layer 282 is formed from a silicon oxide film having a thickness of about 30 nm to 200 nm on the entire surface of the silicon layers 241, 251 and 261 and the underlying protecting layer 281 by a plasma CVD method, a thermal oxidization method, or the like. Here, when the gate-insulating layer 282 is formed using the thermal oxidizing method, silicon layers 241, 251 and 261 can be crystallized into polysilicon layers.

Further, when the silicon layers 241, 251 and 261 are channel-doped, boron ions are injected at this timing in a dose of approximately $1\times10^{12}/cm^2$, for example. As a result, the silicon layers 241, 251 and 261 become low concentration P type silicon layers each having impurity concentration of about $1\times10^{17}/cm^3$ (computed based on impurities after activation annealing).

Then, an ion injecting/selecting mask is formed in a portion of the channel layer of the P channel type TFT and an N channel type TFT, and at this state, phosphorus ions are injected in a dose of about $1\times10^{15}/cm^2$. As a result, high-concentration impurity is introduced to the patterning mask, such that, as shown in FIG. 6(c), high-concentration source regions 241S and 261S and high-concentration drain regions 241D and 261D are formed in the silicon layers 241 and 261.

Then, as shown in FIG. 6(c), a conductive layer 502 for gate electrode formation, composed of a metal film such as a doped silicon or silicide film, an aluminum or chromium film, or a tantalum film, is formed over the surface of the gate insulating layer 282. The thickness of the conductive layer 502 is on the order of approximately 500 nm. Thereafter, as shown in FIG. 6(d), a gate electrode 252 to form a TFT for the P channel type driving circuit, a gate electrode 242 to form a TFT for the pixel, and a gate electrode 262 to form a TFT for the N channel type driving circuit are formed by a patterning method. A driving control signal continuity part 320 (350) and a first layer 121 for the cathode power supply wiring are also formed simultaneously. In this case, the driving control signal continuity part 320 (350) is placed in the dummy region 5.

Subsequently, as shown in FIG. 6(d), the silicon layers 241, 251 and 261 are injected with phosphorus ions in a dose of about $4\times10^{13}/cm^2$ using the gate electrodes 242, 252 and 262 as a mask. As a result, the low concentration impurity is introduced to the gate electrodes 242, 252 and 262 in a self-alignment manner, such that, as shown in FIG. 6(d), low concentration source regions 241b and 261b and low concentration drain regions 241c and 261c are formed in the silicon layers 241 and 261. Further, low concentration impurity regions 251S and 251D are formed in the silicon layer 251.

Next, as shown in FIG. 7(e), an ion injecting/selecting mask 503 is formed to cover portions other than the P channel type TFT 252 for the driving circuit. Boron ions are injected into the silicon layer 251 in a dose amount of about $1.5\times10^{15}/cm^2$ using the ion injecting/selecting mask 503. As a result, since the gate electrode 252 making up the P channel type TFT for the driving circuit functions as a mask, high-concentration impurity is doped into the silicon layer 252 in a self-alignment manner. Accordingly, low concentration impurity regions 251S and 251D are counter-doped and become a source region and a drain region of the P channel type TFT for the driving circuit.

Next, as shown in FIG. 7(f), a first interlayer insulating layer 283 is formed over the entire surface of the substrate 20, and the first interlayer insulating layer 283 is patterned using a photolithographic method so that a contact hole C is formed at a position corresponding to a source electrode and a drain electrode of each TFT.

Next, as shown in FIG. 7(g), a conductive layer 504 is formed of a metal, such as aluminum, chromium, tantalum, or the like, in order to cover the first interlayer insulating layer 283. The thickness of this conductive layer 504 is on the order of about 200 nm to 800 nm. Then, a patterning mask 505 is formed to cover the region 240a where the source electrode and the drain electrode of each TFT are to be formed, the region 310a where a driving voltage continuity part 310 (340) is to be formed, and the region 122a where a second layer of a cathode power supply wire is to be formed, out of the conductive layer 504, while the layer 504 is patterned to form the source electrodes 243, 253 and 263 and the drain electrodes 244, 254 and 264, as shown in FIG. 8(h).

Next, as shown in FIG. 8(j), a second interlayer insulating layer 284 is formed to cover the first interlayer insulating layer 283 in which they have been formed. The second interlayer insulating layer 284 may be formed in the thickness of about 200 nm to 2 μm.

Next, as shown in FIG. 8(j), a portion of the second interlayer insulating layer 284 corresponding to the drain electrode 244 of the driving TFT is removed by etching to form a contact hole 23a.

Thereafter, in order to cover the entire surface of the substrate 20, a conductive film, which becomes a pixel electrode 23, is formed. Also, by patterning the transparent conductive film, a pixel electrode 23 communicated into the drain electrode 244 via the contact hole 23a of the second interlayer insulating layer 284 is formed, and a dummy pattern 26 in the dummy region is also formed, as shown in FIG. 9(k). Further, in FIGS. 3 and 4, the pixel electrodes 23 and the dummy pattern 26 are collectively referred to the pixel electrode 23.

The dummy pattern 26 is not configured to be coupled with underlying metal wirings via the second interlayer insulating layer 284. That is, the dummy pattern 26 is arranged in an island pattern and has substantially the same shape as that of the pixel electrode 23 formed in an effective display region. It may have, of course, a different structure from the shape of the pixel electrode 23 formed in the display region. In this case, the dummy pattern 26 also includes at least some portions located above the driving voltage continuity part 310 (340).

Then, as shown in FIG. 9(l), a lyophilic property controlling layer 25 is formed as an insulating layer on the pixel electrode 23, the dummy pattern 26, and the second interlayer insulating film. Incidentally, the lyophilic property controlling layer 25 is formed on the pixel electrode 23 with apertures in part, so that holes from the pixel electrode 23 can move through the opening 25a (see FIG. 3). By contraries, in the dummy pattern 26 not provided with the opening 25a, the insulating layer (lyophilic property controlling layer) 25 acts as a hole movement blocking layer and, thus, hole movement does not occur. Subsequently, in the lyophilic property controlling layer 25, BM (not shown) is formed in a concave portion formed between two other pixel electrodes 23. Specifically, a film is formed by a sputtering method using metal chromium in the concave portion of the lyophilic property controlling layer 25.

Next, as shown in FIG. 9(m), an organic bank layer 221 is formed to cover a given position of the lyophilic property controlling layer 25, specifically, the BM. As a specific method to form the organic bank layer, the organic layer is formed, for example, by dissolving a register, such as acryl resin, polyimide resin, by means of a solvent, and by coating it by various coating methods, such as a spin coating method, split die coating method and the like, to form an organic layer. Further, a construction material for the organic layer may be any material if it is not soluble in ink solvents as described below and is easily patterned by etching or the like.

Subsequently, the organic layer is patterned using a photolithography technique or an etching technique to form a bank opening 221a, and thus to form an organic bank layer 221 having a wall face at the opening 221a. Here, in the organic bank layer 221, it is preferable that, particularly, a portion forming an outermost peripheral thereof, namely, the face 201a forming an outer side of the surrounding member 201, as above-stated, be formed in such a way that its angle θ with respect to a surface of the base body 200 is 110° C. or more. By forming it at such an angle, it is possible to make step coverage of the cathode 50 and further of the gas barrier layer 40 formed thereon, to be excellent.

Further, in this case, the organic bank layer 221 may be, at least, positioned at an upper side of the driving control signal continuity part 320.

Next, a region representing a lyophilic property and a region representing a liquid-repulsive property are formed on a surface of the organic bank layer 221. In this exemplary embodiment, each region is formed by a plasma treatment. Specifically, the plasma treatment includes a preheating step, an ink-philic step of making each of a top surface of the organic bank layer 221, a wall face of the opening 221a, an electrode face 23c of the pixel electrode 23, and a surface of the lyophilic property controlling layer 25 lyophilic, an ink-repulsive step of making a top surface of the organic bank layer and a wall face of the opening liquid-repulsive, and a cooling step.

The base body (the substrate 20 including a bank or the like) is heated to a predetermined temperature, for example, about 70 to 80° C. and then is subjected to a plasma treatment ($O_2$ plasma treatment) using oxygen as a reaction gas under the atmosphere, as an ink-philic step. Then, a plasma treatment ($CF_4$ plasma treatment) is carried out using methane tetrafluoride as a reaction gas under the atmosphere, as an ink-repulsive step. Thereafter, the base body, which has been heated for the plasma treatments, is cooled to room temperature, and thus a lyophilic property and a liquid-repulsive property are provided to a given level.

It should be noted that this $CF_4$ plasma treatment gives some influence on the electrode face 23c of the pixel electrode 23 and the lyophilic property controlling layer 25. However, since ITO, the material of the pixel electrode 23, and $SiO_2$, $TiO_2$ or the like which constitutes the lyophilic property controlling layer 25, have insufficient affinity for fluorine, a hydroxyl group imparted in the ink-philic step is not substituted by a fluorine group, the lyophilic property being maintained.

Then, a hole transporting layer 70 is formed by a hole transporting layer forming step. In this hole transporting layer forming step, a hole transporting layer material is coated on the electrode face 23c, for example, by a liquid drop discharging method, such as an ink jet method, a screen printing method, or the like. Thereafter, a drying step and a heat treatment are performed to form the hole transporting layer 70 on the electrode 23. In the case of selectively coating the hole transporting layer material, for example, in the ink jet method, the hole transporting layer material is first filled into an ink jet head (not shown), and a discharge nozzle of the ink jet head is placed so as to face the electrode face 23c positioned within the opening 25a formed on the lyophilic property controlling layer 25 and, thereafter, liquid drops are discharged from the discharge nozzle to the electrode face 23c at a controlled liquid amount per one drop while making the ink jet head and the base body (substrate 20) move relatively. The discharged liquid drops are subjected to the drying step, to evaporate dispersion medium or solvent included in the hole transporting layer material, thereby forming the hole transporting layer 70.

Here, the liquid drop discharged from the discharge nozzle spreads over the electrode face 23c which has been subjected to the lyophilic step, and fills the opening 25a of the lyophilic property controlling layer 25. On the other hand, a liquid drop is repulsed from and does not attach to the surface of the organic bank layer 221 which has been subjected to ink-repulsive step. Accordingly, even if the liquid drop is discharged to the surface of the organic bank layer 221 departed from a predetermined discharge position, the surface does not get wet with the liquid drop, and the repelled liquid drop comes into the opening 25a of the lyophilic property controlling layer 25.

Further, following this hole transporting layer forming step, it is possible to perform a step in inert gas atmosphere, such as nitrogen atmosphere, argon atmosphere, or the like, in order to reduce or prevent oxidation of the hole transporting layer 70 and the light-emitting layer 60.

Next, the light-emitting layer 60 is formed in the light-emitting layer forming step. In the light-emitting layer forming step, the light-emitting layer forming material is discharged on the hole transporting layer 70 by, for example, the above-described ink jet method and then is subjected to the drying step and the heat treatment, so that the light-emitting layer 60 is formed in the opening 221a formed in the organic bank layer 221. Thus, in the light-emitting layer forming step, in order to reduce or prevent remelting of the hole transporting layer 70, a nonpolar solvent, in which the hole transporting layer 70 is insoluble, is used as a solvent for the light-emitting layer forming material.

Further, in the light-emitting layer forming step, for example, the light-emitting layer forming material for blue (B) is selectively coated on a blue display region by the above-described ink jet method, and is subjected to the drying step. Similarly, the materials for green (G) and red (R) are selectively coated on the respective corresponding display regions and subjected to the drying step.

As mentioned above, an electron injecting layer may be, if necessary, formed on the light-emitting layer 60.

Next, a cathode 50 is formed by a cathode layer forming step, as shown in FIG. 10(n).

In the cathode layer forming step, an ITO film is formed under reduced pressure according to, for example, a physical vapor deposition method, such as an ion plating method or the like, and is used as the cathode 50. InSnO is used as a target material.

An ITO film having a thickness of 100 nm is made using Ar and $O_2$ as an introduced gas and is used as the cathode 50. At this time, the cathode 50 is formed so as to cover not only the surfaces of the light-emitting layer 60, the organic bank layer 221 and the surrounding member 201, but also the face 201a forming an outer side of the surrounding member 201.

Next, as shown in FIG. 10(o), ultraviolet absorbing layer 30 is formed so as to cover the cathode 50, specifically, all the exposed portions of the cathode 50 on the base body 200. In order to suppress plasma damages, a method to form a film with low power is adopted as a method to form this ultraviolet absorbing layer 30. For example, in this example, titanium oxide or zinc oxide is formed in the thickness of 10 nm to 100 nm and, may be formed in a thickness of about 50 nm under vacuum of $1.0 \times 10^{-2}$ Pa using an ion plating film forming apparatus as a film-forming apparatus and is used as the ultraviolet absorbing layer 30.

Next, a gas barrier layer 40 is formed so as to cover the ultraviolet absorbing layer 30, specifically, to cover all the exposed portions of the ultraviolet absorbing layer 30 on the base body 200. This step of forming the gas barrier layer 40 is performed by a vapor deposition method using plasma at a low temperature. Specifically, a high-density plasma CVD apparatus is used as a film-forming apparatus and $SiH_4$ (monosilane), $O_2$ (oxygen) and $N_2$ (nitrogen) are used as a raw material gas. A silicon nitride film is formed in the film thickness of 30 nm to 500 nm and preferably about 100 nm, and is used as the gas barrier layer 40. By thus forming the barrier layer 40 by a chemical vapor deposition method gas, excellent gas barrier property (a barrier to oxygen or moisture) is obtained. Further, since high energy light, such as ultraviolet light generated in this gas barrier layer forming step excites the underlying ultraviolet absorbing layer 30, active photocatalyst reaction occurs in the ultraviolet absorbing layer 30. Even when impurities, such as organic substances attach to the surface of the ultraviolet absorbing layer 30, they are dissolved and removed by the photocatalyst reaction, allowing the surface of the ultraviolet absorbing layer 30 to be kept clean. Consequently, enhanced close adherence between the ultraviolet absorbing layer 30 and the gas barrier layer 40 is obtained, and thereby the gas barrier layer 40 can be formed as a fine film having fewer defects.

In such a method to manufacture the EL display device 1, since the ultraviolet absorbing layer 30 is formed prior to the formation of the gas barrier layer 40, light, such as ultraviolet generated in the barrier layer forming step using a high-density plasma is absorbed by this ultraviolet absorbing layer 30, thereby reducing preventing the light-emitting layer 60 which is placed below the absorption layer from being deteriorated by the light. Further, in case where the EL display device 1 fabricated by such a method is used at the outdoors or the like, light resistance of the device is enhanced since the ultraviolet absorbing layer 30 absorbs ultraviolet lights included in the external light or the like.

Further, in the manufacturing method of this exemplary embodiment, since a material having photocatalyst activity is used for the ultraviolet absorbing layer 30, light such as ultraviolet is not simply absorbed but also positively utilized as energy to dissolve impurities or the like. Consequently, during the gas barrier layer forming step, the surface of the ultraviolet absorbing layer 30 is always maintained in a clean state while maintaining the excited energy. Accordingly, the gas barrier layer 40 becomes denser without any defect, thereby enhancing gas barrier property.

Further, since the steps of forming the cathode 50, the ultraviolet absorbing layer 30, and the gas barrier layer 40 are continuously performed under reduced pressure without returning to the atmospheric pressure, it is possible to perform the steps rapidly. The quality of the films is also enhanced because of no mixture of impurity due to returning to atmospheric pressure.

Further, in the EL display device 1 obtained according to the manufacturing method, it is possible to reduce or prevent penetration of oxygen or moisture since the outer side of the surrounding member 201 is covered with the cathode 50, the ultraviolet absorbing layer 30, and the gas barrier layer 40 (i.e., the outer side of the light-emitting layer 60 is covered with the gas barrier layer by the surrounding member 201, the cathode 50, the ultraviolet absorbing layer 30, and the gas barrier layer 40). Accordingly, deterioration or the like of the light-emitting layer or the electrode due to oxygen or moisture is suppressed and thus long-termed life span of the light-emitting element is achieved.

Second Exemplary Embodiment

Figure 11:
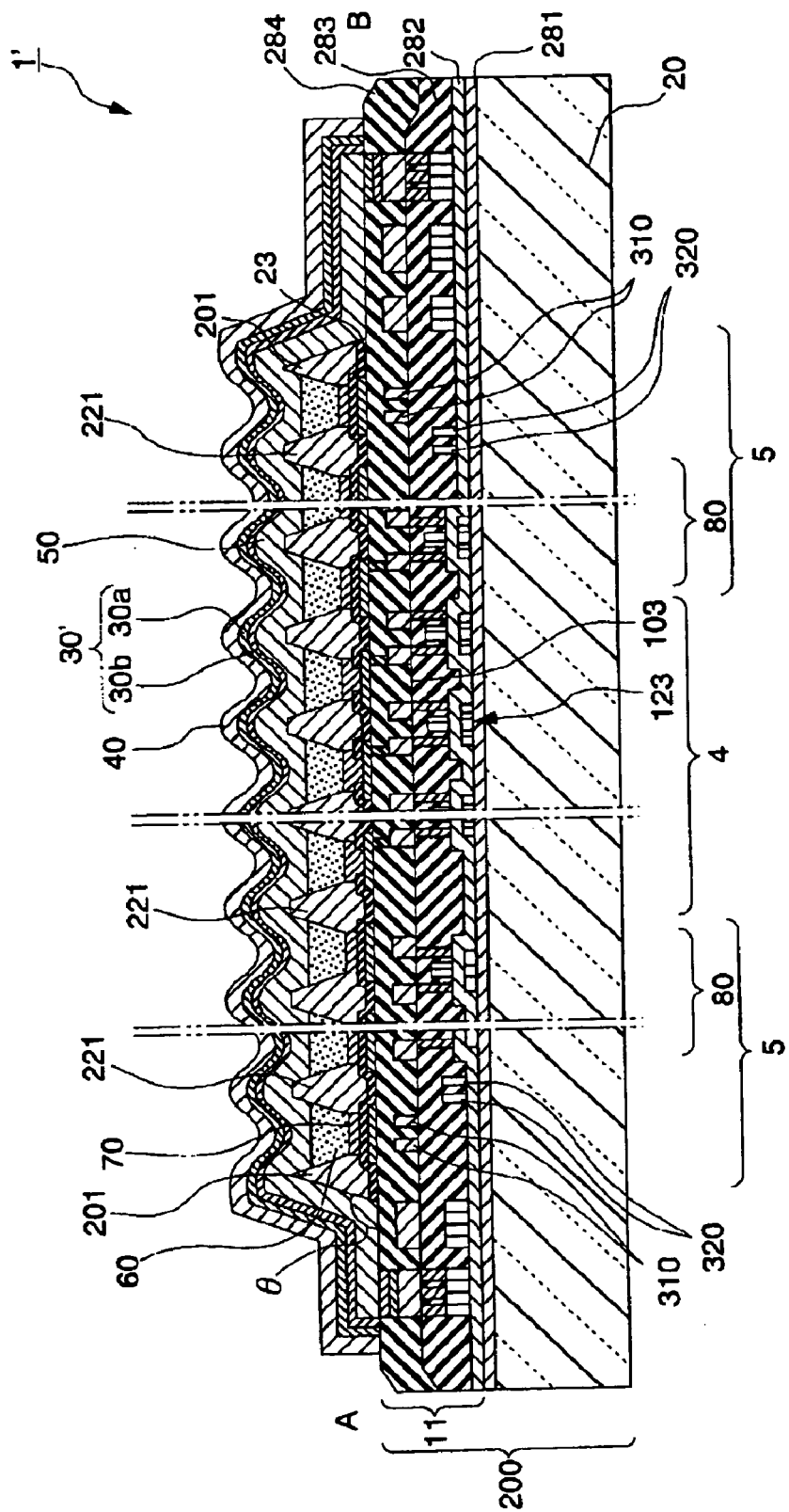
FIG. 11 is a sectional view of an electro-optical device according to a second exemplary embodiment of the present invention.

Next, an electro-optical device according to a second exemplary embodiment of the present invention will be described with reference to FIG. 11.

This exemplary embodiment enhances insulating property between the ultraviolet absorbing layer and the cathode by making nitrogen to be included in the interface at the side of the cathode 50 of the ultraviolet absorbing layer in the configuration of the first exemplary embodiment.

An ultraviolet absorbing layer 30' provided to cover the cathode 50 in an electro-optical device 1' is formed of a laminated film of a first absorption layer 30a and a second absorption layer 30b. A barrier layer 40 is provided on the second absorption layer 30b.

Specifically, the first absorption layer 30a, contiguous with the cathode 50, and the second absorption layer 30b, contiguous with the gas barrier layer 40, are formed of TiON (oxynitride titanium) and $TiO_2$, respectively. Since addition of nitrogen to $TiO_2$ increases insulating property, it is possible to reduce or prevent charges generated when the first absorption layer 30a is excited by light in the gas barrier forming step from flowing into the cathode 50. Thus, deterioration of the light-emitting layer 60 due to such charges is reduced or prevented, which makes it possible to acquire a device of long-term life span. Further, inclusion of nitrogen in the first absorption layer 30a increases close adherence with the cathode 50 or the gas barrier layer 40, thereby forming a dense film.

Further, beside the configuration in which the ultraviolet absorbing layer 30' is formed of a multilayered film, as in this exemplary embodiment, for example, a construction is allowed in which nitrogen content in the ultraviolet absorbing layer formed of an oxide semiconductor is continuously changed from lower layer side (i.e., the cathode 50 side).

Because the remaining is the same as the first exemplary embodiment, explanation thereon will be omitted.

Thus, in this exemplary embodiment, it is possible to avoid deterioration of the light-emitting layer 60 due to charges generated by the photoexcitation of the second absorption layer 30b, as well as to fabricate an electro-optical device having excellent water resistance, oxygen resistance, and light resistance, achieving much longer life span of the device.

Third Exemplary Embodiment

Figure 12:
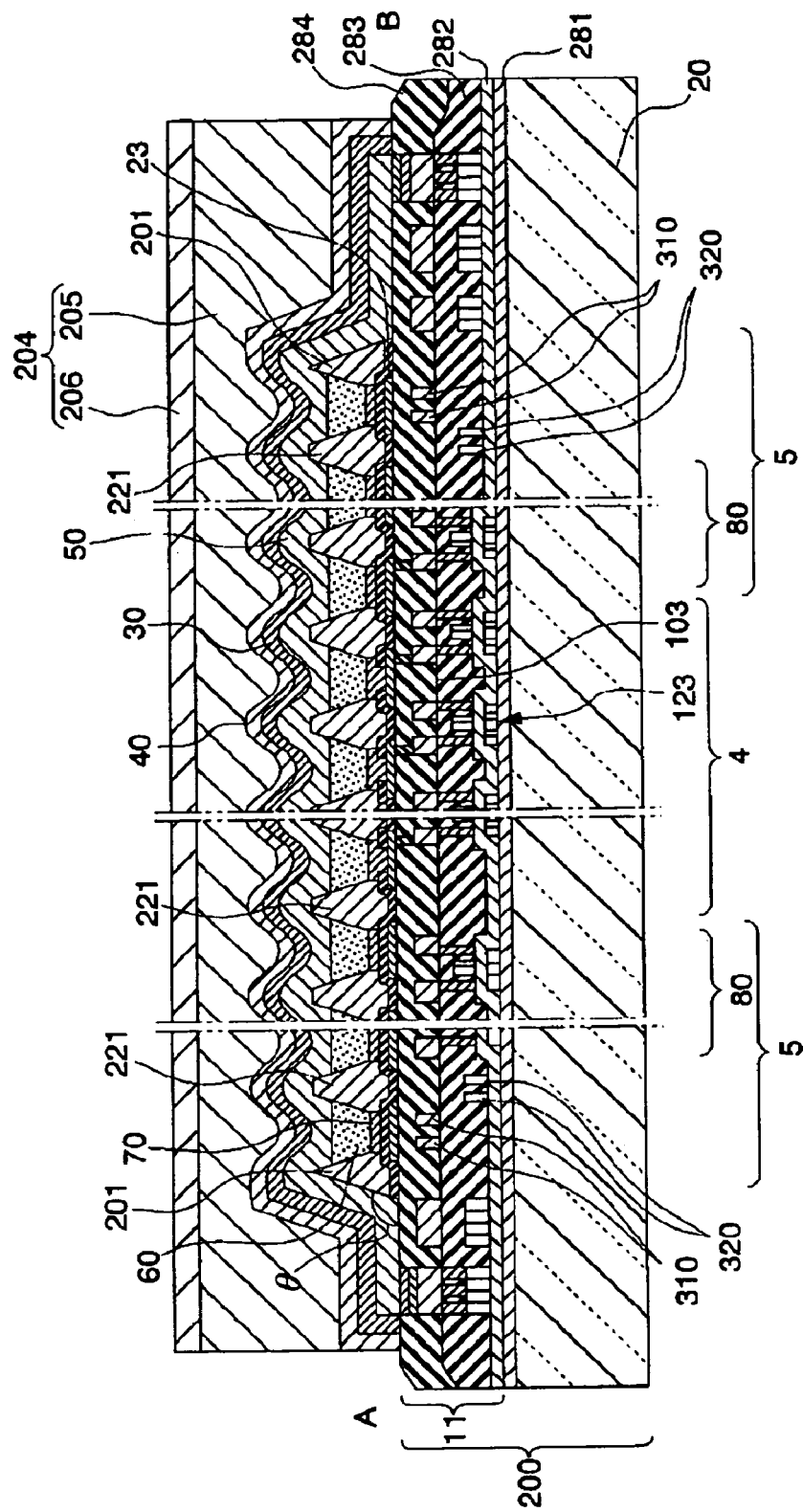
FIG. 12 is a sectional view of an electro-optical device according to a third exemplary embodiment of the present invention.

Next, an electro-optical device according to a third exemplary embodiment of the present invention will be described with reference to FIG. 12.

In this exemplary embodiment, the outer side of the gas barrier layer 40 of the first exemplary embodiment is sealed by the protecting layer 204. That is, in this exemplary embodiment, the protecting layer 204 is provided on the base body 200 to cover the gas barrier layer 40. This protecting layer 204 is composed of an adhesive layer 205 provided in the gas barrier layer 40 and a protective substrate 206 disposed thereon.

The adhesive layer 205 has a function to adhere to the gas barrier layer 40 and to buffer mechanical shock from the exterior. For example, the adhesive layer 205 is formed of an adhesive composed of a urethane, acryl, epoxy, polyolefin, or siliconresin or the like, which is more flexible and has a lower glass transition point than the material of the protective substrate 206, which is described below. Further, a silane coupling agent or an alkoxysilane may be added to such an adhesive. By doing so, enhanced close adherence between the formed adhesive layer 205 and the gas barrier layer 40 is available. Thus higher mechanical shock resistance is obtained. Further, in particular, if the gas barrier layer 40 is formed of a silicon compound, close adherence with the gas barrier layer 40 can be enhanced by the silane coupling agent or alkoxysilane and gas barrier property of the gas barrier layer 40 can be increased.

The protective substrate 206 is provided on the adhesive layer 205 so as to make up a surface side of the protecting layer 204, and have at least one of the functions including pressure resistance, wear resistance, external light reflection blocking property, gas barrier property, ultraviolet blocking property, or the like. Specifically, the protective substrate 206 is formed of a high-molecular weight layer (a plastic film of PET, acryl resin, polycarbonate, polyolefin, or the like), a DLC (diamond like carbon) layer, glass or the like.

In this exemplary embodiment, the adhesive layer 205 constitutes a buffer layer of an aspect of the present invention, and the protective substrate 206 constitutes a surface-protecting layer of an aspect of the present invention. When the EL display device of this example is configured as a top emission-type device, both the protective substrate 206 and the adhesive layer 205 must be light transmissive, while they are not required to be light transmissive when it is of a bottom emission-type.

Thus, if the protecting layer 204 is provided on the gas barrier layer 40, the protective substrate 206 has pressure resistance or wear resistance, light reflection blocking property, gas barrier property, ultraviolet blocking property, or the like. Therefore, the light-emitting layer 60, the cathode 50, and the gas barrier layer can be also protected by the protective substrate 206, obtaining long-term life span of the light-emitting element.

Further, since the adhesive layer 205 provides a buffering function against mechanical shock, when the mechanical shock is applied from the exterior, the mechanical shock against the gas barrier layer 40 or the light-emitting element therein can be mitigated, and thus the functional deterioration of the light-emitting element due to such mechanical shock can be reduced or prevented.

Fourth Exemplary Embodiment

Figure 13:
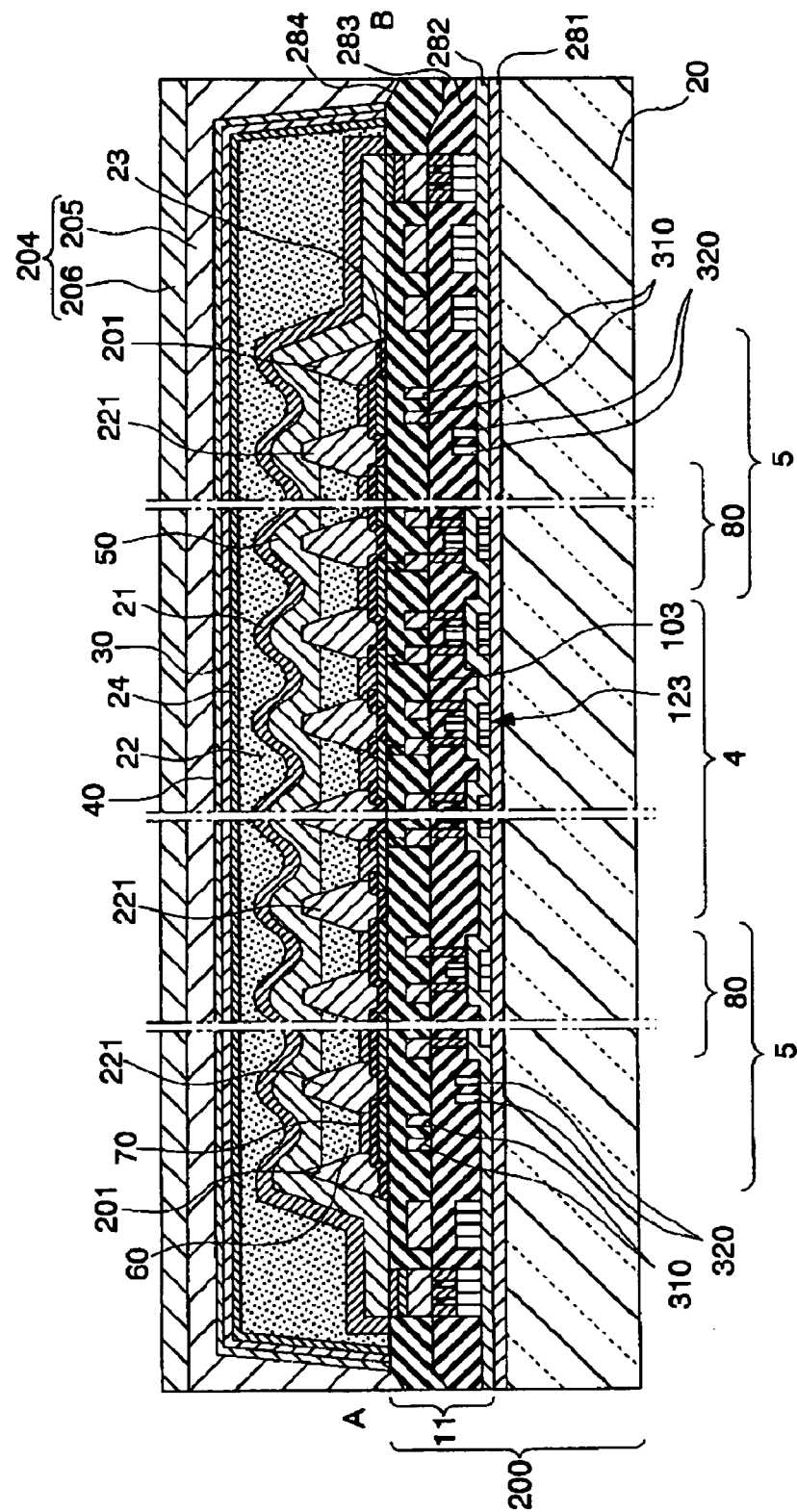
FIG. 13 is a sectional view of an electro-optical device according to a fourth exemplary embodiment of the present invention.

Next, an electro-optical device according to a fourth exemplary embodiment of the present invention will be described with reference to FIG. 13.

This exemplary embodiment has a configuration in which there are provided a cathode protecting layer (electrode protecting layer) 21, a buffer layer 22, and a buffer layer protecting layer 24 in sequence from lower side, between the cathode 50 and the ultraviolet absorbing layer 30 in the configuration of the third exemplary embodiment.

The buffer layer 22 primarily planarizes irregularities of a base (irregularities on the substrate surface formed by a bank structure), and aims at dispersing external stress applied from the substrate side upon forming the gas barrier layer, and reducing or preventing cracks from generating on the gas barrier layer, which is a hard film formed of a silicon compound, such as silicon nitride or silicon oxynitride. A material having some flexibility may be used for this buffer layer 22 in order to absorb the stress from the substrate side. For example, a transparent organic material containing nitrogen atoms is very suitable. Further, a material curable at a low temperature of 140° C. or less is suitable. For example, the following derivatives may be adopted: a derivative of acryl polyol, polyester polyol, polyurethane polyol or the like, as a primary component, polymerized by mixing diisocyanate compound, such as tolylene diisocyanate, and xylene diisocyanate; a derivative of mixed and polymerized bisphenol-based epoxy and amine compound. Further, it is preferable that the film thickness of the buffer layer 22 be 0.5 μm to 10 μm to have a sufficient stress buffer function. Further, a silane compound, such as a silane coupling or a silazane compound to enhance close adherence with a cathode protecting layer 21 or a buffer layer protecting layer 24 described below, fine particles to reduce or prevent curing shrinkage, or the like may be included in this buffer layer 22.

Such a buffer layer 22 can be formed by a liquid phase method. As a method to coat a liquid material including a forming material of the buffer layer 22, a slit coating method, a die coating method, a curtain coating method or the like, capable of uniform coat to a large area, is very suitable. Viscosity of the liquid material is, for example, 100 mPa·s or less and may be 1 mPa·s to 30 mpa·s. Further, dilution with an organic solvent may be used to lower the viscosity. In this case, because the cathode and the organic light-emitting layer dislike moisture, it is preferable to dilute the liquid material using oil-philic organic solvent, such as toluene, xylene, cyclohexane, methyl ethyl ketone, ethyl acetate or the like.

The cathode protecting layer 21 is provided to protect an element during manufacturing steps, for example, by blocking gas components by exposing the substrate to the atmosphere upon forming the buffer layer 22, or by protecting the cathode 50 from the solvents or outer gases contiguous with the cathode 50, as well as for maintaining adhesion between the cathode 50 and the buffer layer 22. For example, a silicon compound having transparency, such as silicon nitride or silicon oxynitride, is preferably adopted. This cathode-protecting layer 21 can be formed, for example, by a high-density plasma film-forming method, such as an ECR plasma sputtering method, an ECR-CVD method, an ICP-CVD method, a helicon wave plasma CVD method, a surface wave plasma CVD method, or an ion plating method. At this time, in order to reduce or prevent plasma damage, it is preferable that the film may be formed with a low voltage and the film thickness is 10 nm to 200 nm.

Since the buffer layer protecting layer 24 is disposed to protect the buffer layer 22 from active electrons emitted when the ultraviolet absorbing layer 30 is excited upon forming the gas barrier layer, a transparent insulating material, such as a silicon compound can be suitably used for it. This buffer layer protecting layer 24 can be formed by, for example, a high-density plasma film-forming method, such as an ECR plasma sputtering method, an ECR-CVD method, an ICP-CVD method, a helicon wave plasma CVD method, a surface wave plasma CVD method, an ion plating method. The forming requirements of this film may be the same as those of the cathode-protecting layer 21. Further, in order to increase close adherence between the buffer layer protecting layer 24 and the buffer layer 22, the surface of the buffer layer 22 may be activated by an oxygen plasma treatment or the like, before forming the buffer layer protecting layer 24.

Further, the cathode protecting layer 21 is formed so as to cover the entire cathode 50. The buffer layer 22 is formed so as to cover the entire cathode protecting layer 21. Also the buffer layer protecting layer 24 is formed so as to cover the entire buffer layer 22.

The ultraviolet absorbing layer 30 and the gas barrier layer 40 are laminated on the thus formed buffer layer-protecting layer 24 in sequence. The gas barrier layer 40 is contiguous with the second interlayer insulating film 284 having a gas barrier property and formed of a silicon compound or the like so as to cover the buffer layer protecting layer 24 entirely. The light-emitting element disposed in the effective display region is surrounded by the gas barrier layer 40 and the second interlayer insulating film 284 and is protected from penetration of moisture or the like. Further, the protecting layer 204 is provided on the gas barrier layer 40 for the sake of holding strength of the entire panel and of reducing or preventing damage of the gas barrier layer 40 or the like. The protecting layer 204 is composed of a transparent adhesive layer 205 and a transparent protective substrate 206.

The adhesive layer 205 and the protective substrate 206 are formed of the same materials as those of the adhesive layer 205 and the protective substrate 206 in the third exemplary embodiment, respectively. That is, an adhesive agent composed of transparent resin material, such as epoxy resin, acryl resin, urethane resin, silicon resin or the like, may be preferably used for the adhesive layer 205. Further, for hardening at low temperature, a two-liquid mixing type agent having an added curing agent such as isothiocyanate or the like may be used. Further, glass, a transparent plastic film (of PET, acryl, polycarbonate, polyolefin or the like) or the like may be used for the protective substrate 206. In the case of using a plastic film, a structure, specific to the adhesive, is feasible by forming the adhesive layer 205 on the film in advance, thereby easily corresponding to a large size. Further, an optics structure, such as an ultraviolet absorbing layer, a light reflection blocking layer, a heat release layer, lens, a mirror, or the like, may be provided in the protective substrate 206.

The protecting layer 204 can be provided, for example, by coating the adhesive layer 205 on the protective substrate 206 side or on the gas barrier layer 40, adhering the protective substrate 206 and the base body 200 by compression, and heat-hardening the adhesive layer 205 at 120° C. or less. Others are the same as the third exemplary embodiment.

Since this exemplary embodiment provides the buffer layer 22 as a planarizing film at a lower layer side of the gas barrier layer 40, it is possible to form the gas barrier layer 40 as a denser and less defective film.

Next, an electronic apparatus of an aspect of the present invention will be described. The electronic apparatus of an aspect of the present invention has the above-described EL display device (electro-optical device) as a display portion. Specific examples of the electronic apparatus are as shown in FIG. 14.

Figure 14:
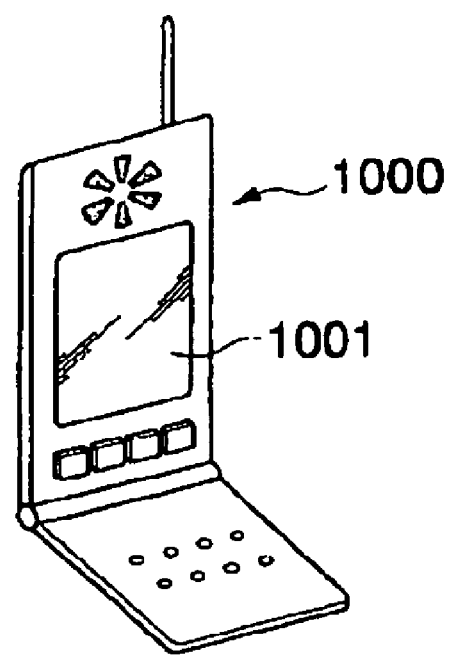
FIG. 14 is a perspective view showing an example of an electronic apparatus of an aspect of the present invention.

FIG. 14 is a perspective view showing an example of a mobile telephone. In FIG. 14, reference numeral 1000 indicates a primary body of the mobile telephone, and reference numeral 1001 indicates a display portion using the above-described EL display device.

Since the electronic apparatus, as shown in FIG. 14, is equipped with a display portion having the EL display device (i.e., electro-optical device), long-term life span for a light-emitting element of the EL display device making up the display portion is obtained.

It should be noted that the present invention is not limited to the above-stated exemplary embodiments and may be implemented in several variations without departing from the spirit of the present invention.

For example, in each of the exemplary embodiments, although the gas barrier layer 40 is configured as a single layer, this gas barrier layer may be a multilayered film formed from a plurality of layers. For example, the gas barrier layer may be of a structure in which a first barrier layer and a second barrier layer are laminated in this order from the ultraviolet absorbing layer 30 side, and the second barrier layer may be formed of silicon nitride while the first barrier layer may be formed of silicon oxynitride. Accordingly, since close adherence between the ultraviolet absorbing layer and the gas barrier layer is increased, it is possible to form a dense gas barrier layer having fewer defects, thereby further enhancing the gas barrier property. In addition, the first barrier layer or the second barrier layer may be composed of, for example, an inorganic compound, such as alumina or a tantalum oxide, titanium oxide or the like, besides the silicon compound. Thus, if at least the first barrier layer is formed of an inorganic compound, close adherence between the gas barrier layer (the first barrier layer) and the ultraviolet absorbing layer becomes excellent since the ultraviolet absorbing layer is composed of an oxide semiconductor.

Further, in the above-stated exemplary embodiments, although the EL display device has been described as of a top emission-type structure, the present invention is not limited to it and is applicable to a bottom emission-type and a bi-side display light-emitting type device. More particularly, in case where the display device is formed as of a bottom emission-type structure, it is not required to employ a transparent electrode as the cathode 50. However, even in this case, it is preferable that a face side contiguous with at least the gas barrier layer 40 of the cathode 50 is formed of an inorganic oxide. By doing so, close adherence between the ultraviolet absorbing layer 30 of an inorganic compound and the cathode 50 becomes excellent, and it makes it possible to form the ultraviolet absorbing layer 30 as a dense layer having less defects.

Further, in the case where the EL display device is of the bottom emission-type or bi-side color light-emitting type, the switching TFT 112 or the driving TFT 123 on the base body 200 may be formed directly beneath the lyophilic property controlling layer 25 and the organic bank layer 221, rather than directly beneath the light-emitting element, thereby increasing aperture ratio.

In addition, in the EL display device in each exemplary embodiment, the first electrode of the present invention is operated as an anode and the second electrode is operated as a cathode. The first electrode may be operated as a cathode and the second electrode may be operated as an anode. However, in such a case, it is required to counterchange a position where the light-emitting layer 60 is formed with a position where the hole transporting layer 70 is formed.

Further, although the exemplary embodiments show examples in which the EL display device 1 is applied to the electro-optical device of the present invention, the present invention is not limited to it and can be applied to any type of electro-optical device basically, only if the second electrode is disposed at the outer side of the substrate.

What is claimed is:

1. An electro-optical device, comprising:
   a first electrode;
   an electro-optical layer;
   a second electrode;
   an ultraviolet absorbing layer comprising a semiconductor material having photocatalyst activity, wherein the semiconductor is selected from the group consisting of titanium oxide, strontium titanate, tin oxide, niobium oxide, indium oxide, and gallium oxide; and
   a gas barrier layer, each layer being laminated in sequence on a substrate.

2. The electro-optical device according to claim 1,
   a protecting layer is provided on the gas barrier layer.

3. The electro-optical device according to claim 2,
   a surface protecting layer provided on the protecting layer.

4. An electronic apparatus, comprising:
   the electro-optical device according to claim 1.

* * * * *